United States Patent
Wada et al.

(10) Patent No.: US 7,219,422 B2
(45) Date of Patent: May 22, 2007

(54) FABRICATION METHOD OF SEMICONDUCTOR INTEGRATED CIRCUIT DEVICE

(75) Inventors: Yuji Wada, Tachikawa (JP); Susumu Kasukabe, Yokohama (JP); Takehiko Hasebe, Yokohama (JP); Yasunori Narizuka, Hiratsuka (JP); Akira Yabushita, Yokohama (JP); Terutaka Mori, Urayasu (JP); Akio Hasebe, Kodaira (JP); Yasuhiro Motoyama, Kodaira (JP); Teruo Shoji, Mitaka (JP); Masakazu Sueyoshi, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 469 days.

(21) Appl. No.: 10/765,917

(22) Filed: Jan. 29, 2004

(65) Prior Publication Data

US 2004/0183556 A1 Sep. 23, 2004

(30) Foreign Application Priority Data

Mar. 19, 2003 (JP) .............................. 2003-075429

(51) Int. Cl.
*H05K 3/00* (2006.01)
*H01R 9/00* (2006.01)

(52) U.S. Cl. .................. 29/842; 29/25.01; 29/417; 29/831; 29/846; 29/854; 324/754; 324/755; 324/758; 324/761; 324/765; 427/129; 427/130; 438/14; 438/15; 438/16; 438/17; 438/18

(58) Field of Classification Search ............... 29/25.01, 29/417, 592.1, 593, 831, 842, 846, 854; 324/754, 324/755, 758, 761, 765; 438/14–18; 427/129, 427/130
See application file for complete search history.

(56) References Cited

U.S. PATENT DOCUMENTS

| 3,605,230 | A | * | 9/1971 | Edwards ..................... 492/53 |
| 5,945,834 | A | * | 8/1999 | Nakata et al. ............... 324/754 |
| 6,147,505 | A | * | 11/2000 | Ott et al. ..................... 324/754 |
| 6,696,849 | B2 | * | 2/2004 | Ban et al. .................... 324/760 |
| 6,759,258 | B2 | * | 7/2004 | Kasukabe et al. ............. 438/17 |

FOREIGN PATENT DOCUMENTS

| JP | 7-283280 | 10/1995 |
| JP | 10-308423 | 11/1998 |
| JP | 11-23615 | 1/1999 |
| JP | 11-97471 | 4/1999 |

OTHER PUBLICATIONS

"Microrelay packaging technology using flip-chip assembly"; Miller, D.C.; Wenge Zhang; Bright, V.M.; Micro Electro Mechanical Systems, 2000. MEMS 2000. The Thirteenth Annual International Conference on Jan. 23-27, 2000; pp. 265-270.*

* cited by examiner

Primary Examiner—Paul D Kim
(74) Attorney, Agent, or Firm—Antonelli, Terry, Stout & Kraus, LLP

(57) ABSTRACT

The fabrication of a semiconductor integrated circuit device involves testing using a pushing mechanism that is constructed by forming, over the upper surface of a thin film probe, a reinforcing material having a linear expansion coefficient (thermal expansion coefficient) almost equal to that of a wafer to be tested; forming a groove in the reinforcing material above a contact terminal; placing an elastomer in the groove so that a predetermined amount projects out of the groove; and disposing a pusher and another elastomer to sandwich the pusher between the elastomers. With the use of such a probe, it is possible to improve the throughput of wafer-level electrical testing of a semiconductor integrated circuit.

8 Claims, 23 Drawing Sheets

17: ELASTOMER (SECOND ELASTIC MATERIAL)
18: PUSHER (PUSHING MEMBER)
20: THIN FILM PROBE (FIRST SHEET)
24: CONTACT TERMINAL
27: REINFORCING MATERIAL (FIRST REINFORCING MEMBER)
28: GROOVE
29: ELASTOMER (FIRST ELASTIMC MATERIAL)
30: PUSHING MECHANISM

17: ELASTOMER (SECOND ELASTIC MATERIAL)
18: PUSHER (PUSHING MEMBER)
20: THIN FILM PROBE (FIRST SHEET)
24: CONTACT TERMINAL
27: REINFORCING MATERIAL (FIRST REINFORCING MEMBER)
28: GROOVE
29: ELASTOMER (FIRST ELASTIMC MATERIAL)
30: PUSHING MECHANISM

FABRICATION METHOD OF SEMICONDUCTOR INTEGRATED CIRCUIT DEVICE

BACKGROUND OF THE INVENTION

The present invention relates to a technique for use in the fabrication of a semiconductor integrated circuit device; and, more particularly, the invention relates to a technique that is effective when applied to a wafer-level electrical test of a semiconductor integrated circuit device.

A probe test is one of the techniques employed for the inspection of semiconductor integrated circuit devices. It includes a function test for confirming whether a wafer functions to specification or not, or a test for judging whether the wafer is non-defective or defective by measuring its DC operating characteristics and its AC operating characteristics.

In recent years, a probe test of semiconductor integrated circuit devices tends to be carried out while they are in the stage of a semiconductor wafer (which will hereinafter simply be called a "wafer") to satisfy the requirements for shipment of the devices in the wafer form (differentiation of products), KGD (Known Good Die) (improvement in the yield of MCP (Multi-Chip Package)) and reduction in the total cost.

For example, there is a prober that is used for a wafer-level probe test, which comprises a multilayer film having a plurality of contact terminals disposed in a predetermined region on the probing side, a lead-out wire to be electrically connected to each contact terminal and a ground layer opposite to the lead-out wire with an insulating layer sandwiched therebetween, and the film is attached to a holding member to eliminate slack in the region. Further, this prober has a constitution in which a specific compliance mechanism is engaged with the holding member while a contact pressure is applied thereto by a contact pressure applying unit (for example, refer to Patent Documents 1 and 2).

As a unit for forming the contact terminals and lead-out wires, there is a technique of forming molds for the formation of the contact terminals by anisotropic etching of a silicon wafer, forming the contact terminals and lead-out wires by using the molds, and then removing the silicon wafer molds after the formation of the contact terminals and lead-out wires (for example, refer to Patent Documents 3 and 4).

Patent Document 1: Japanese Patent Application Laid-Open No. Hei 11(1999)-23615

Patent Document 2: Japanese Patent Application Laid-Open No. Hei 10(1998)-308423

Patent Document 3: Japanese Patent Application Laid-Open No. Hei 11(1999)-97471

Patent Document 4: Japanese Patent Application Laid-Open No. Hei 7(1995)-283280

SUMMARY OF THE INVENTION

With expansion of the capacity of memory products and an increase in the amount of production of logic products with a built-in memory, for each type of semiconductor integrated circuit device, the time required for a wafer-level probe test is on the increase. Therefore, there is a demand for improvement of the throughput of the wafer-level probe test. In order to improve this throughput, it is necessary to reduce the time spent for the test per wafer. The time $T0$ required for the test per wafer is represented by the equation: $T0 = (T1+T2) \times N + T3$, wherein $T1$ is the time necessary for a single test by a prober, $T2$ is the time necessary for indexing a prober, $N$ is the number of times needed to bring a probe (probe needle) of the prober into contact with the wafer (which will hereinafter be called the "touchdown times"), and $T3$ is the time necessary for replacement of the wafer with a new one. According to this equation, the number of touchdown times must be reduced in order to improve the throughput of the wafer-level probe test.

For a reduction in the fabrication cost of a semiconductor integrated circuit device, miniaturization of semiconductor elements and interconnects to narrow the area of a semiconductor chip (which will hereinafter simply be called a "chip") and thereby increase the number of chips obtained from one wafer has been pursued. Such a tendency toward miniaturization accelerates or narrowing of the pitch between test pads (bonding pads) and also a decrease in their area. When a test is carried out using a prober having a cantilever type probe, the probe is wiped on the surface of a test pad in order to break a natural oxide film formed on the surface of the test pad and to bring the probe into contact with the test pad. By this wiping of the probe, however, not only is the natural oxide film broken, but also scratches appear on the surface of the test pad itself due to the wiping. In consideration of the tendency of the test pad area to be decreased, as described above, there is a relative increase in the ratio of such scratches in the surface of the test pad, leading to the problem that the adhesive force of a bonding wire connected to the test pad in the later step will be lowered.

An object of the present invention is to provide a technique that is capable of improving the throughput of an electrical test of a semiconductor integrated circuit that is in wafer form.

Another object of the present invention is to provide a technique that is capable of reducing damage caused to a test pad during testing of a semiconductor integrated circuit device.

The above-described and the other objects and novel features of the present invention will be more apparent from the following description herein and the accompanying drawings.

Of the aspects of the invention disclosed in the present application, typical ones will be summarized briefly.

In one aspect of the present invention, there is provided a method of fabrication of a semiconductor integrated circuit device, comprising the steps of preparing a semiconductor wafer, which has been divided into a plurality chip regions, each having a semiconductor integrated circuit formed thereover, and which has, formed over the main surface, a plurality of first electrodes to be electrically connected with the semiconductor integrated circuit; preparing a first card for retaining a first sheet, which has a plurality of contact terminals to be brought into contact with the plurality of first electrodes and interconnects to be electrically connected with the plurality of contact terminals, so as to cause the tip portions of the plurality of contact terminals to protrude toward the main surface of the semiconductor wafer; and bringing the plurality of contact terminals into contact with the plurality of first electrodes to perform an electrical test of the semiconductor integrated circuit device. The tip portions of the plurality of contact terminals are disposed over a first surface of the first sheet, and a plurality of second electrodes to be electrically connected with the interconnects are disposed over a second surface which is opposite to the first surface of the first sheet. The first card has a plurality of connection mechanisms to be electrically connected to the plurality of second electrodes and pushing mechanisms for pushing the plurality of contact terminals toward the plurality of first electrodes.

The connection mechanisms in this combination each comprise an elastic contact needle for pushing the second electrodes in response to a load generated upon contact of the plurality of contact terminals with the plurality of first electrodes, and a retainer member for retaining the contact needle, which is disposed to come into contact with the second electrodes over the second surface of the first sheet. Each of the pushing mechanisms is formed by successively stacking a first elastic material, a pushing member and a second elastic material one after another from the side of the first sheet and is disposed above the plurality of contact terminals over the second surface of the first sheet, and any one of the pushing mechanisms pushes at least one of the contact terminals.

In another aspect of the present invention, there is provided a method of fabrication of a semiconductor integrated circuit device, comprising the steps of preparing a semiconductor wafer, which has been divided into a plurality chip regions, each having a semiconductor integrated circuit formed thereover, and which has, formed over the main surface, a plurality of first electrodes to be electrically connected with the semiconductor integrated circuit; preparing a first card for retaining a first sheet, which has a plurality of contact terminals to be brought into contact with the plurality of first electrodes and interconnects to be electrically connected with the plurality of contact terminals, so as to cause the tip portions of the plurality of contact terminals to protrude toward the main surface of the semiconductor wafer; and bringing the plurality of contact terminals into contact with the plurality of first electrodes to perform an electrical test of the semiconductor integrated circuit device. The tip portions of the plurality of contact terminals are disposed over a first surface of the first sheet, and a plurality of second electrodes to be electrically connected with the interconnects are disposed over a second surface which is opposite to the first surface of the first sheet. The first card has a plurality of connection mechanisms to be electrically connected to the plurality of second electrodes.

The connection mechanisms in this combination each comprise an elastic contact needle for pushing the second electrodes in response to a load generated upon contact of the plurality of contact terminals with the plurality of first electrodes, and a retainer member for retaining the contact needle, which is disposed to come into contact with the second electrodes over the second surface of the first sheet, and the probe needle pushes the second electrodes before the plurality of contact terminals are brought into contact with the plurality of first electrodes.

In a further aspect of the present invention, there is provided a method of fabrication of a semiconductor integrated circuit device, comprising the steps of preparing a semiconductor wafer, which has been divided into a plurality chip regions, each having a semiconductor integrated circuit formed thereover, and which has, formed over the main surface, a plurality of first electrodes to be electrically connected with the semiconductor integrated circuit; preparing a first card for retaining a first sheet, which has a plurality of contact terminals to be brought into contact with the plurality of first electrodes and interconnects to be electrically connected with the plurality of contact terminals, so as to cause the tip portions of the plurality of contact terminals to protrude toward the main surface of the semiconductor wafer; and bringing the plurality of contact terminals into contact with the plurality of first electrodes to perform an electrical test of the semiconductor integrated circuit device. The tip portions of the plurality of contact terminals are disposed over a first surface of the first sheet, and a plurality of second electrodes to be electrically connected with the interconnects are disposed over a second surface, which is opposite to the first surface of the first sheet, and the first card has a plurality of connection mechanisms to be electrically connected to the plurality of second electrodes.

The connection mechanisms in this combination each comprise an elastic contact needle for pushing the surface of the second electrodes in response to a load generated upon contact of the plurality of contact terminals with the plurality of first electrodes, and a retainer member for retaining the contact needle, which is disposed to come into control with the second electrodes over the second surface of the first sheet, and the surface of each of the plurality of second electrodes to be brought into contact with the contact needle has been planarized.

DETAILED DESCRIPTION OF THE PREFERRED EMBODIMENTS

Prior to the detailed description of the present invention, the meanings of various terms used herein will be described.

The term "wafer" means a single crystal silicon substrate (usually having a substantially circular plane), an SOI (Silicon On Insulator) substrate, a sapphire substrate, a glass substrate, or any other insulating, semi-insulating or semiconductor substrate, or a composite substrate thereof which is used for the fabrication of integrated circuits. The term "semiconductor integrated circuit device" as used herein means not only those devices fabricated on a semiconductor or insulator substrate, such as silicon wafer or sapphire substrate, but also those devices formed over other insulating substrates, such as glass substrates, e.g., TFT (Thin Film Transistor) and STN (Super-Twisted-Nematic) liquid crystals, unless otherwise specifically indicated.

The term "device surface" means a main surface of a wafer on which device patterns corresponding to plural chip regions are formed by lithography.

The term "contact mechanism" means a silicon wafer integrally formed with interconnect layers and contact terminals having a tip portion connected therewith by employing a wafer process similar to that used for the fabrication of a semiconductor integrated circuit, that is, a patterning method using photolithography, CVD (Chemical Vapor Deposition), sputtering and etching in any combination.

The term "thin film probe" means a thin film which has, disposed thereover, contact terminals which are to come in contact with a wafer to be tested, and interconnects which are led from the contact terminals and have an electrode for outside contact. The thickness of this thin film is about 10 μm to 100 μM.

Figure 28:
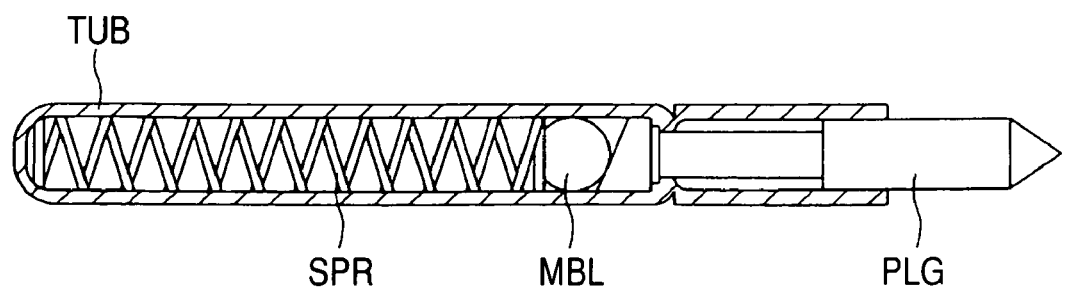
FIG. 28 is a fragmentary cross-sectional view illustrating one example of a POGO pin.

The term "POGO pin" means a contact needle to be electrically connected with an electrode (terminal) by pressing a contact pin (plunger (contact needle)) against the electrode while making use of the elastic force of a spring (coil spring). It has, for example, a constitution as illustrated in FIG. 28, in which a spring SPR disposed in a tube (retainer member) TUB made of a metal transmits an elastic force to a contact pin PLG via a metal ball MBL.

The term "probe card" means a structural body having a contact terminal which is to be brought into contact with a wafer to be tested and a multilayer wiring substrate, while the term "semiconductor prober" means a prober having a probe card and a sample holder on which a wafer to be tested is placed.

The term "probe testing" means electrical testing of a semiconductor integrated circuit by pressing the tip portion of the contact terminal against an electrode formed over the main surface of a chip region for judging whether the circuit is defective or non-defective, based on the results of a function test for determining whether the product functions to specification or tests of the DC operating characteristics the and AC operating characteristics.

The term "burn-in test" means a test in which temperature and voltage stresses on chips for screening chips which may be defective in the future.

The term "simultaneous testing of multiple chip regions" means simultaneous electrical testing of a plurality of chip regions of a semiconductor integrated circuit. The term "simultaneous testing of super multiple chip regions" means simultaneous electrical testing of at least 64 chip regions (at least about 1000 pins) of a semiconductor integrated circuit.

The term "KGD (Known Good Die)" means a chip that is guaranteed as non-defective among chips to be mounted in a bare chip form, such as those in flip chip bonding. The term "chips guaranteed as non-defective" means that they have already been screened by a similar test to that employed for packaged products.

The term "index time" means a time from the completion of the test of one chip or wafer until a new chip or wafer is positioned and becomes ready for the test, when chips or wafers are tested one by one.

In the following description of the embodiments, a description will be made based on a division of the subject matter in plural sections or in plural embodiments if necessary for convenience's sake. These plural sections or embodiments are not to be construed as independent of each other, but may be in a relation such that one is a modification example, details or complementary description of a part or whole of the other one, unless otherwise specifically indicated.

In the following description of the embodiments, when reference is made to a number of elements (including the number, value, amount and range), the number is not limited to a specific number, but can be greater than or less than the specific number, unless otherwise specifically indicated or it is principally apparent that the number is limited to the specific number.

Moreover, in the following description of the embodiments, it is needless to say that the constituting elements (including element steps) are not always essential, unless otherwise specifically indicated or it is principally apparent that they are essential.

Similarly, in the following description of the embodiments, when reference is made to a shape or positional relationship of the constituting elements, that substantially analogous or similar to it is also embraced, unless otherwise specifically indicated or it is principally apparent that it is not. This also applies to the above-described value and range.

In all of the drawings, members of like function will be identified by like reference numerals, and overlapping descriptions thereof will be omitted. In the drawings, even a plan view is sometimes partially hatched for facilitating an understanding thereof.

In the following description of the embodiments, MISFET (Metal Insulator Semiconductor Field Effect Transistor) typifying field effect transistors will be abbreviated as MIS.

The embodiments of the present invention will hereinafter be described specifically based on the drawings.

Embodiment 1

Figure 1:
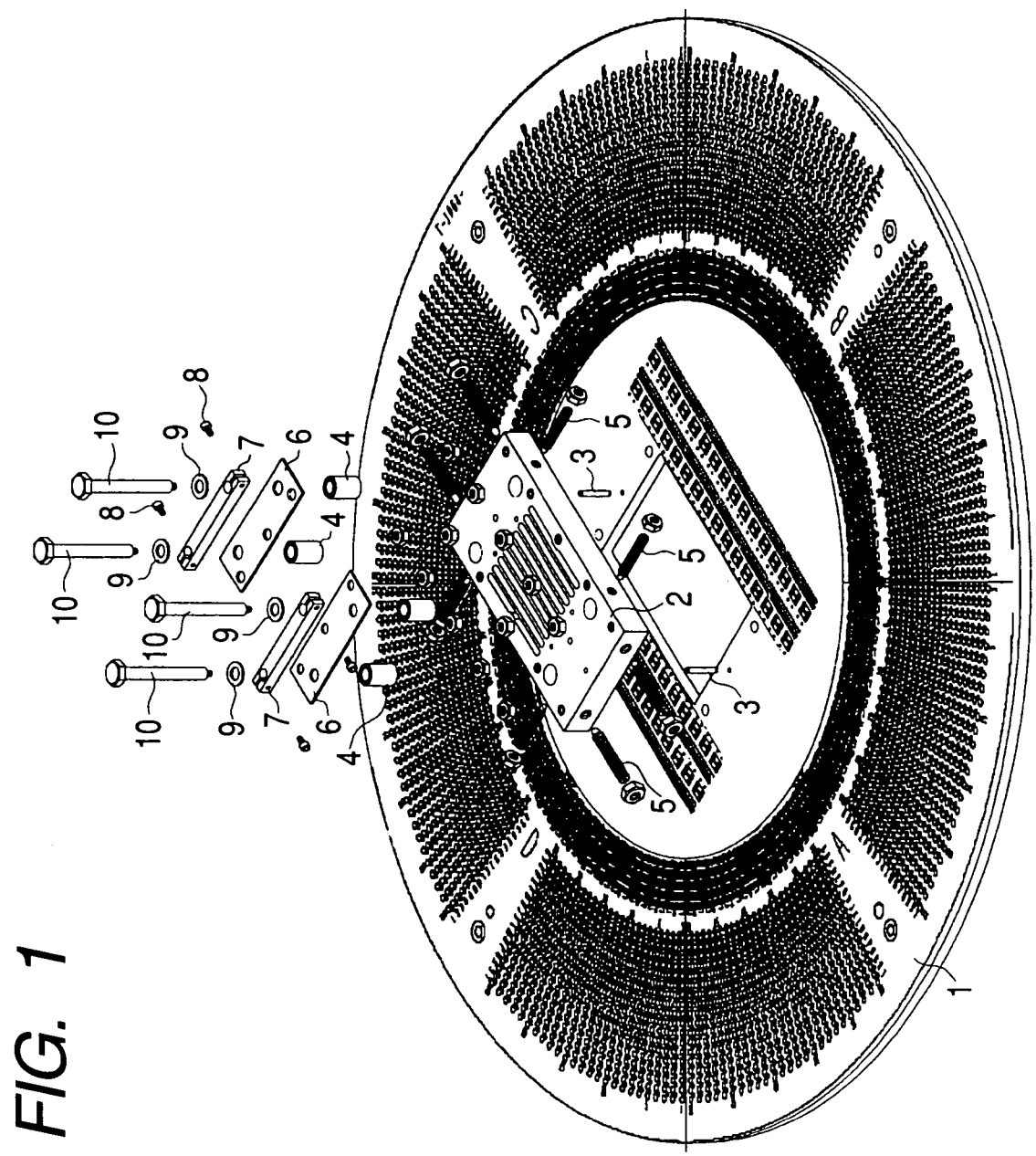
FIG. 1 is an exploded perspective view of a probe card according to one embodiment of the present invention.

FIG. 1 is a fragmentary perspective view illustrating a probe card (first card) representative of Embodiment 1, as seen from an upper angle.

The probe card of Embodiment 1 is formed, for example, by attaching an upper pushing unit and a lower pushing unit on a multilayer wiring substrate 1. As illustrated in FIG. 1, the upper pushing unit attached onto the upper surface of the multilayer wiring substrate 1 comprises a base holder 2, a pin 3, a linear push 4, a spring plunger 5, a lid 6, an adjust holder 7, a bolt 8, a shim ring 9, an adjust bolt 10 and the like.

The base holder 2 receives a load that is applied to the probe card when it is brought into contact with a wafer to be tested and prevents the probe card from being distorted by the load. This structure makes it possible to avoid the occurrence of a relative positional shift between a contact terminal of the probe card and an electrode (test pad (first electrode)) on the main surface of the wafer with which the contact terminal comes into contact. The relative position between the contact terminal and electrode will be described later.

The pin 3 is installed between the multilayer wiring substrate 1 and base holder 2, and it determines the position of the base holder 2 on the multilayer wiring substrate 1.

The linear push 4 has a function, in the base holder 2, of guiding the adjust bolt 10, which extends from the upper pushing unit towards the lower pushing unit, as will be described later, and it is disposed so as to maintain a space for the vertical movement of the adjust bolt 10.

The spring plunger 5 is attached to the base holder 2 from the side surface thereof and serves to control the position of the adjust bolt 10 in a horizontal direction relative to the upper surface of the multilayer wiring substrate 1 (which direction will hereinafter be called the "XY direction").

The lid 6 serves to prevent the linear push 4, which has been disposed in a hole formed in the base holder 2, from protruding over the base holder 2. The shim ring 9 controls the space between the adjust bolt 10 and adjust holder 7.

The adjust bolt 10 reaches the lower pushing unit, which will be described later, through the upper pushing unit and multilayer wiring substrate 1, and it controls the position, by rotation, in the height direction of the lower pushing unit. When the adjust bolt 10 is fixed, the upper pushing unit, the multilayer wiring substrate 1 and the lower pushing unit are integrated. After the completion of the adjustment of the position by the adjust bolt 10 in the height direction of the lower pushing unit, the adjust bolt 10 is fastened by the adjust holder 7 and bolt 8 to prevent the adjust bolt 10 from rotating and being disposed at a wrong position in the height direction of the lower pushing unit.

Figure 2:
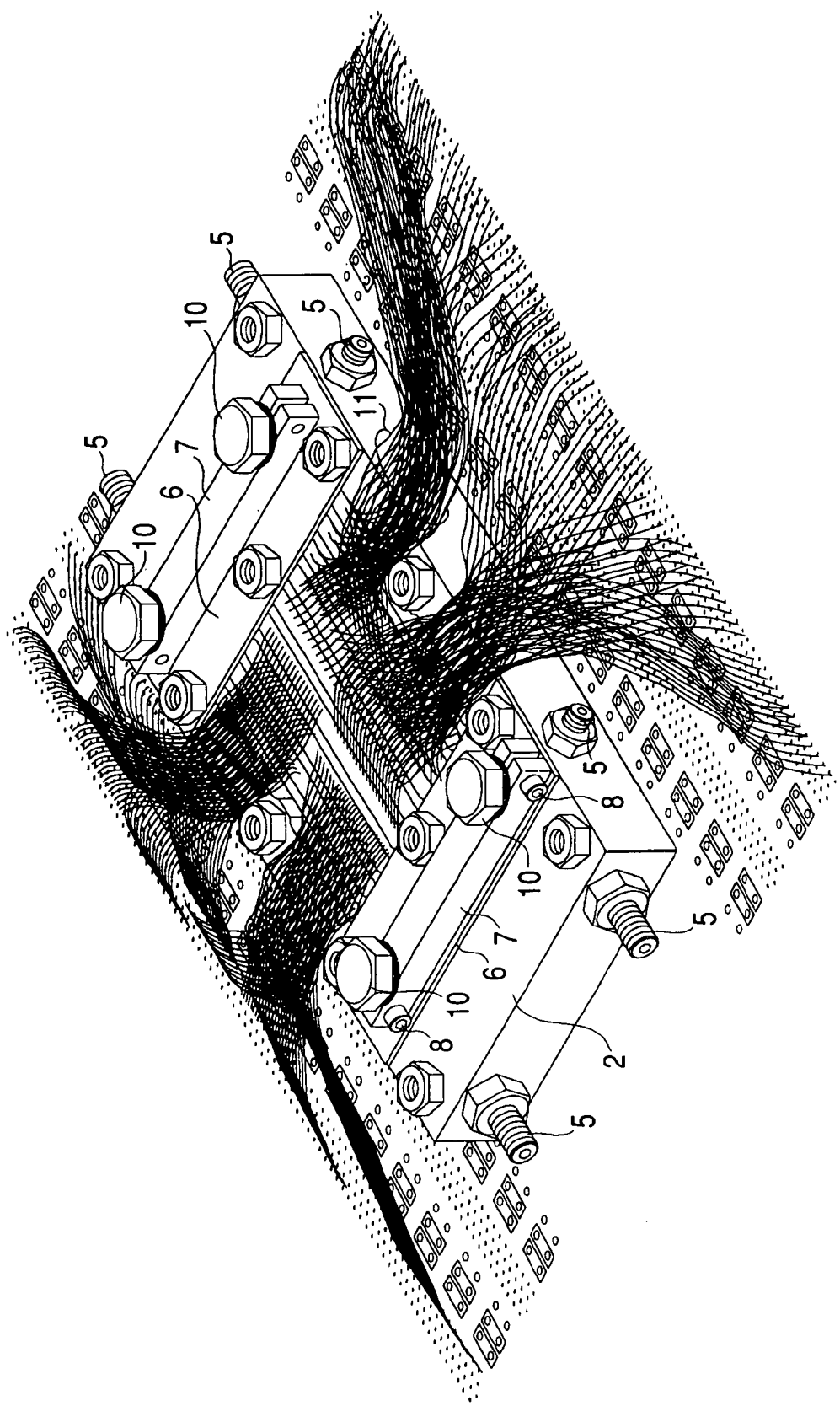
FIG. 2 is a fragmentary perspective view of the upper surface of the probe card according to the one embodiment of the present invention.

FIG. 2 is a fragmentary perspective view illustrating a fragment of the upper surface of the multilayer wiring substrate 1 to which the upper pushing unit has been attached.

As illustrated in FIG. 2, a number of wires 11, which are electrically connected to a contact terminal of the lower pushing unit, are pulled out from the base holder 2, and they are electrically connected to a circuit formed over the multilayer wiring substrate 1 by being connected to respective connecting terminals over the upper surface of the multilayer wiring substrate 1.

Figure 3:
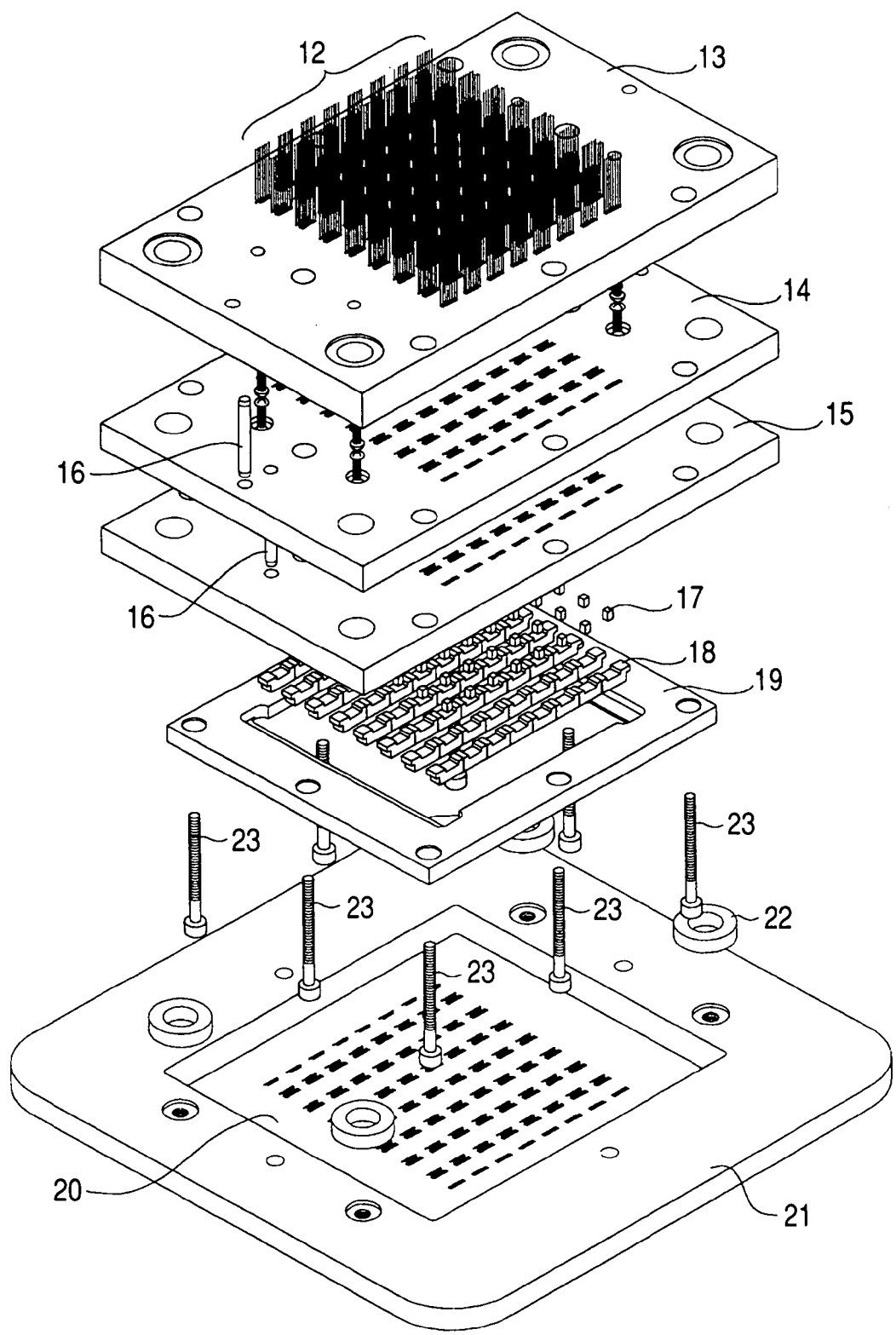
FIG. 3 is an exploded perspective view illustrating the constitution of a lower pushing unit included in the probe card according to the one embodiment of the present invention.

FIG. 3 is a perspective view illustrating the constitution of the lower pushing unit to be attached to the lower surface of the multilayer wiring substrate 1.

As illustrated in FIG. 3, the lower pushing unit comprises POGO pins (connection mechanism) 12, a supporting pin plate 13, POGO pin seating plates 14, 15, pins 16, elastomer elements (second elastic material) 17, pushers (pushing member) 18, a retainer plate 19, a thin film probe (first sheet) 20, a stretch holder 21, silicon rubber elements 22, screws 23 and the like.

The POGO pins 12 are disposed in the number necessary for simultaneous testing of multiple chip regions or simultaneous testing of super multiple chip regions. Each of the POGO pins 12, at the lower end thereof, is in contact with the thin film probe 20 and, at the upper end thereof, electrically connected to the wires 11 (refer to FIG. 2).

The POGO pin seating plates 14, 15, which have having the POGO pins disposed thereon, are used for alignment of the POGO pins 12 in the XY direction, and they are fixed to the base holder 2 (refer to FIG. 1) by the pin 16 and the pin 3 (refer to FIG. 1), whereby the relative position to the base holder 2 in the XY direction is determined.

The stretch holder 21 holds the thin film probe 20, which is attached to the holder and maintains the correct position of the thin film probe 20 in the XY direction and height direction with high accuracy.

The pushers 18 are formed, for example, of SUS (stainless). The number of the pushers 18 installed is equal to the number of chip regions to be brought into contact with a plurality of contact terminals of the below-described probe card upon electrical testing of a semiconductor integrated circuit using the probe card of Embodiment 1. The elastomer elements 17 are formed, for example, of a silicone rubber, and one elastomer element is installed on each pusher 18. While having such an elastomer installed on the pusher, the pusher 18 is brought into contact with a predetermined position of the thin film probe 20 and applies a pushing pressure to the individual chip regions. By the application of this pushing pressure, deformation can be achieved according to the surface shape of the wafer to be tested, which will however be described later.

The receiving pin plate 13, the POGO pin supporting plates 14, 15, the elastomer elements 17 and the pushers 18 are integrated with high precision by being fixed to the retainer plate 19 by a screw 23. The silicone rubber elements 22 are placed between the POGO pin supporting plate 15 and stretch holder 21. By application of a load in a height direction, a relative position between the POGO pin supporting plate 15 and stretch holder 21 in the XY direction is fixed.

The lower pushing unit is fixed by the adjust bolt 10, which was described with reference to FIG. 1, and it is integrated with the above-described upper pushing unit (refer to FIG. 1) and multilayer wiring substrate 1 (refer to FIG. 1).

Figure 4:
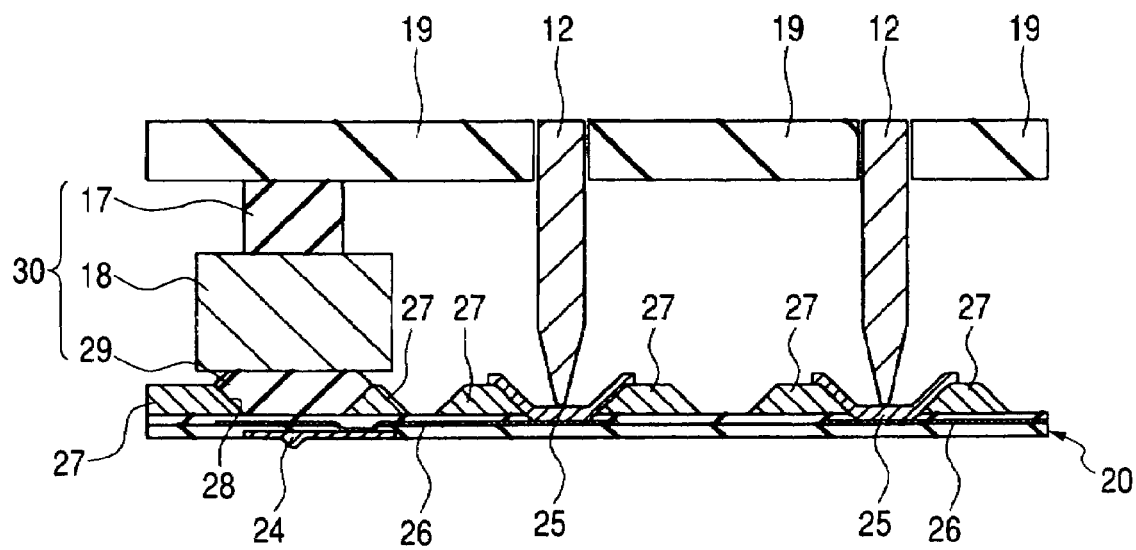
FIG. 4 is a fragmentary cross-sectional view of the lower pushing unit illustrated in FIG. 3.

FIG. 4 is a fragmentary cross-sectional view of the lower pushing unit.

As illustrated in FIG. 4, a protruding contact terminal 24 is formed over the lower surface (first surface) of the thin film probe 20. Over the upper surface (second surface) of the thin film probe 20, a land (second electrode) 25 is formed. The contact terminal 24 and land 25 are electrically connected via an interconnect 26 formed in the thin film probe 20. Under such a state, the tip of the POGO pin 12 comes into contact with the land 25, whereby the POGO pin 12 is electrically connected with the contact terminal 24. In the semiconductor prober of Embodiment 1, such a contact terminal 24 comes into contact with an electrode (test pad) formed over the main surface of the chip region, whereby an electrical testing of a semiconductor integrated circuit device is carried out. Even when there is something wrong, such as a disconnection of the interconnect 26 in the thin film probe 20, whereby a repairing of the probe card is needed, as in the conventional case, only the replacement of the thin film probe 20 with a new one of the same kind is necessary, so that the time for repair can be reduced.

Over the upper surface of the thin film probe 20, a reinforcing material (first reinforcing member) 27 has been formed. As this reinforcing material 27, a material having a linear expansion coefficient (thermal expansion coefficient (first linear expansion coefficient)) substantially equal to that of the wafer to be tested is selected. This makes it possible to maintain the relative position between the contact terminal 24 and the electrode (test pad) formed over the main surface in the chip region uniformly even in the case of a temperature change, if any, and, moreover, to bring the contact terminal 24 into contact with a predetermined electrode (test pad) without failure. When a wafer to be tested is composed mainly of silicon, silicon and 42 alloy can be given as examples of the material of the reinforcing material 27.

Above the contact terminal 24, a groove 28 is formed in the reinforcing material 27 and an elastomer (first elastic material) 29 is formed to fill the groove 28 therewith so as to exceed the groove by a predetermined amount. Over the elastomer 29, the pusher 18 and elastomer element 17 are disposed in such a manner that the pusher 18 is sandwiched between the elastomers 17 and 29. Thus, the elastomer 29, pusher 18 and elastomer 17 constitute a pushing mechanism 30. In this Embodiment 1, a material softer (having a smaller elastic modulus) than the elastomer 17 is selected for the elastomer 29. According to an experiment made by the present inventors, by selecting a proper material for the elastomer 29, the contact terminal 24 can be brought into contact with the electrode (test pad) without failure even when strains, such as warp, appear in a wafer to be tested, and when a plurality of electrodes (test pads) with which the contact terminal 24 come in contact do not have a uniform height. This makes it possible to improve the throughput of the electrical testing of a semiconductor integrated circuit device using the probe card of Embodiment 1.

Figure 5:
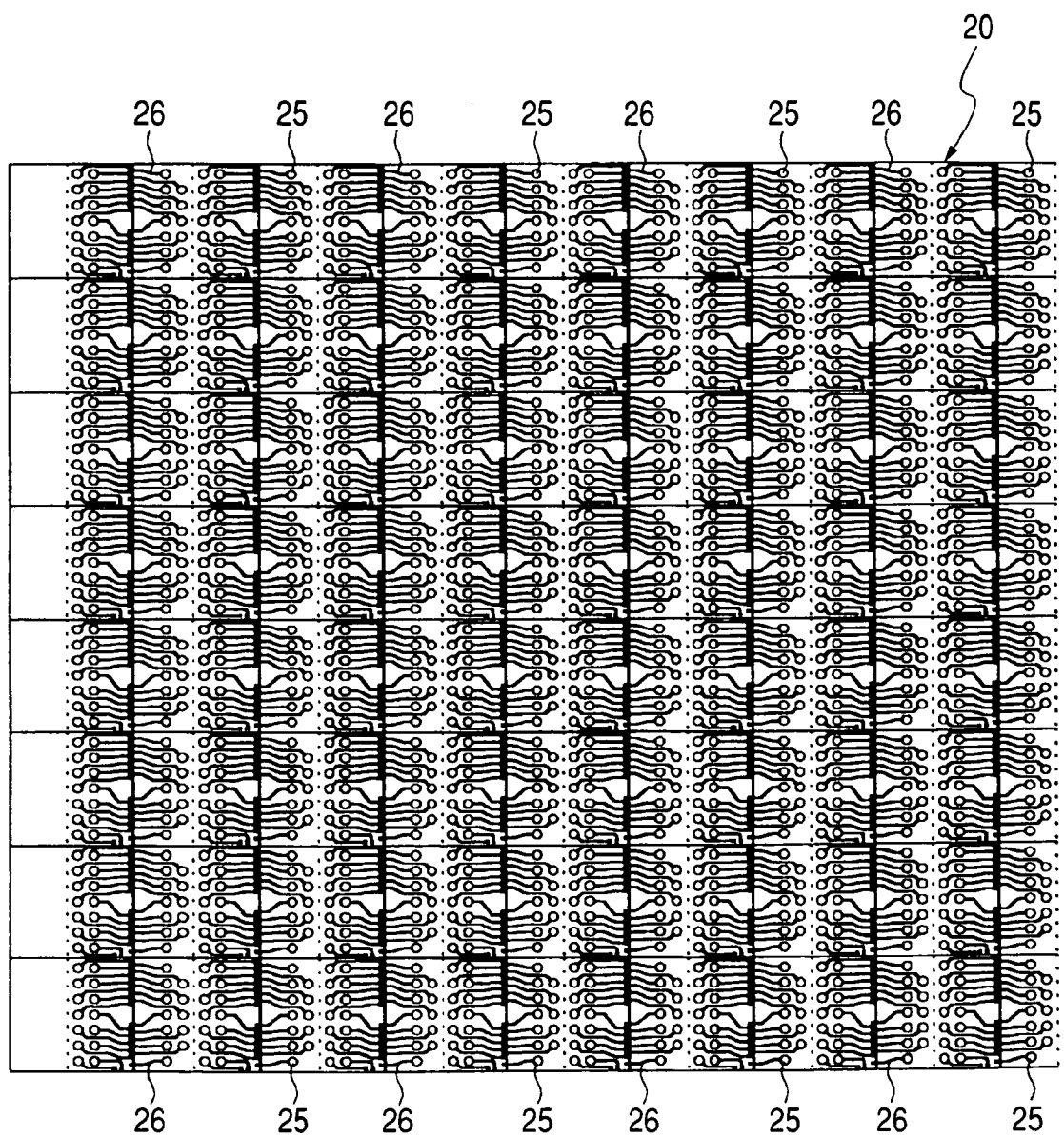
FIG. 5 is a plan view of a thin film probe included in the lower pushing unit illustrated in FIG. 3.
Figure 6:
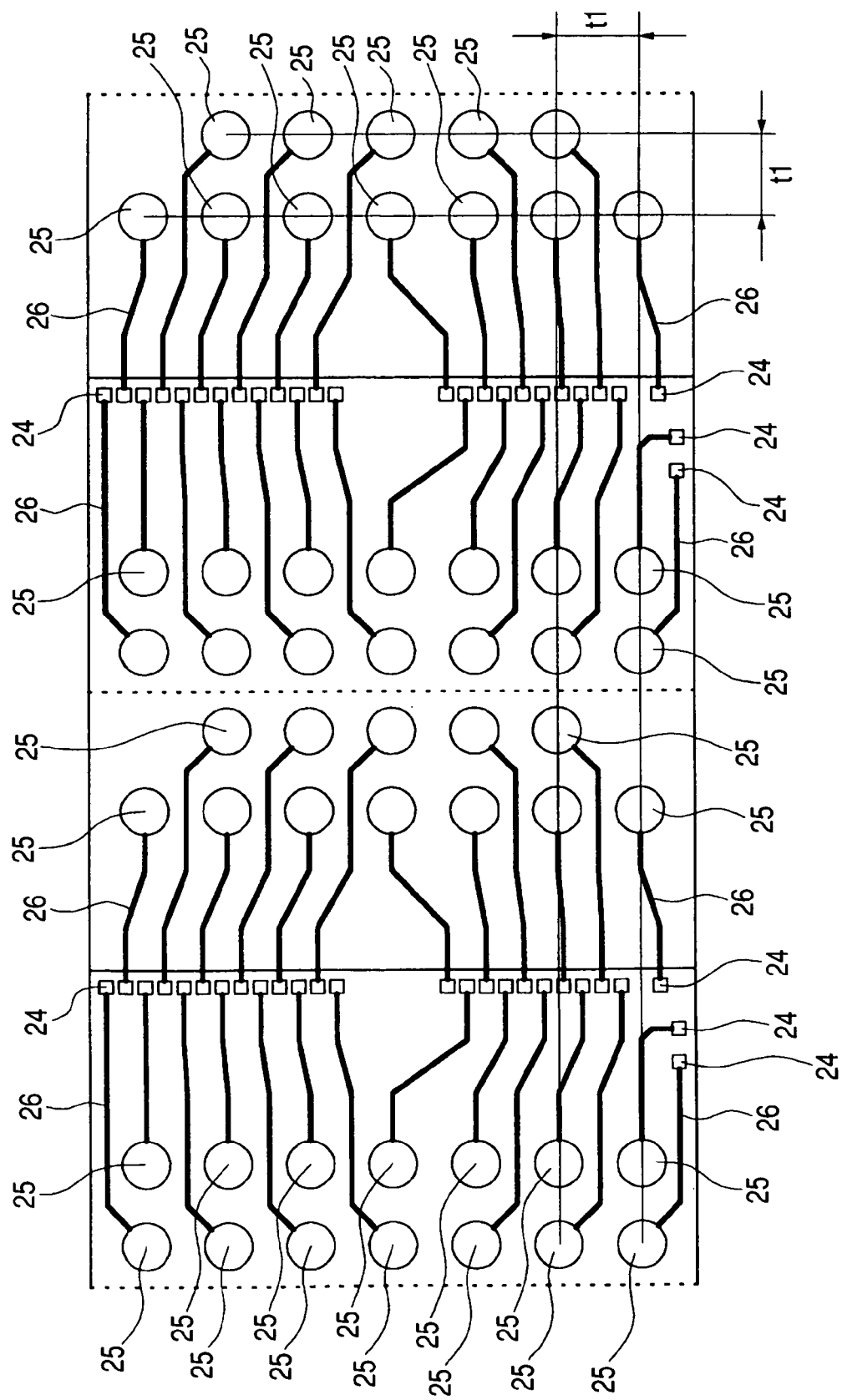
FIG. 6 is a fragmentary enlarged plan view of the thin film probe illustrated in FIG. 5.

FIG. 5 is a plan view of the whole plane pattern of the thin film probe 20, which is illustrated so as to emphasize the layout patterns of the land 25 and interconnect 26. It shows, for example, a constitution permitting simultaneous testing of 8 rows by 8 columns, constituting 64 chip regions in total. FIG. 6 illustrates a part of the plane pattern of FIG. 5 and is a fragmentary enlarged plan view illustrating portions corresponding to two of the chip regions. In FIG. 6, only the tip portion of the contact terminal 24 is illustrated, and 26 contact terminals 24 are disposed per chip region.

In this Embodiment 1, any two adjacent lands 25 are separated by a space (first space) $t1$ that is wider than the space between the tip portions of any two adjacent contact terminals 24, and, at the same time, these lands are equally spaced. This is because the position of the tip portion of the contact terminal 24 is determined by the position of an electrode (test pad) which is to be brought into contact with the contact terminal 24 and is formed over the main surface of a wafer to be tested, but the land 25 can be disposed to facilitate the path of the interconnect 26 and disposal of the POGO pin 12. In this Embodiment 1, the space $t1$ between any two adjacent lands 25 can be set, for example, at about 0.65 mm when the chip size is about 5 mm×5 mm, so that 26 contact terminals 24 are disposed, and the space between the tip portions of any two adjacent contact terminals 24 is about several tens of μm.

According to the thin film probe 20, as described above, since the tip portion of the contact terminal 24 is disposed in alignment with each electrode (test pad) all over the main surface of a wafer to be tested and the POGO pin 12, which is to be electrically connected with the contact terminal 24, is arranged to extend vertically upwards, the chip size can be reduced; and, even if the electrodes (test pads) become small and are arranged at a narrow pitch, wafer-level testing of a semiconductor integrated circuit can be carried out irrespective of the arrangement of the electrodes (test pads).

Figure 7:
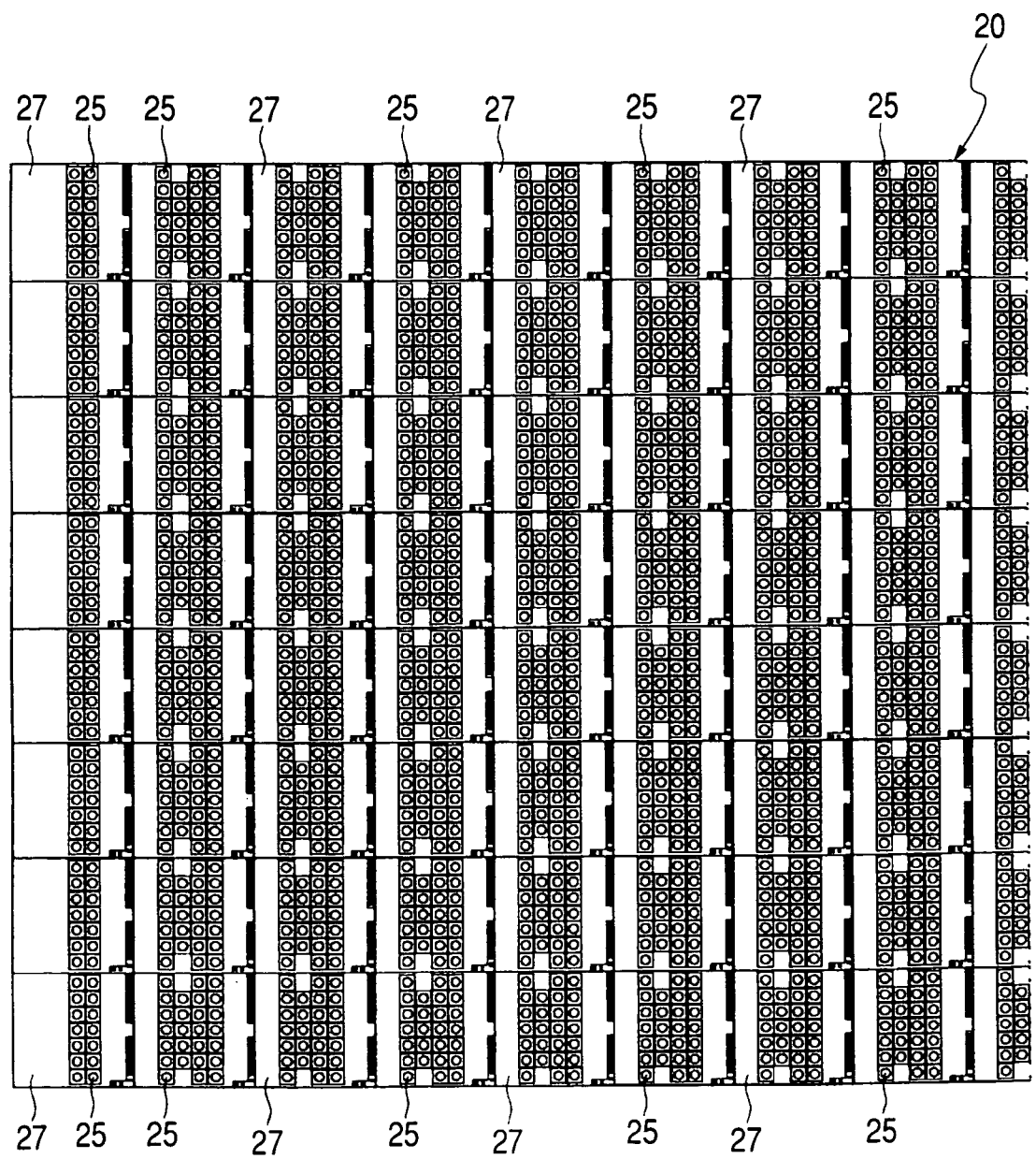
FIG. 7 is a plan view of a thin film probe included in the lower pushing unit illustrated in FIG. 3.
Figure 8:
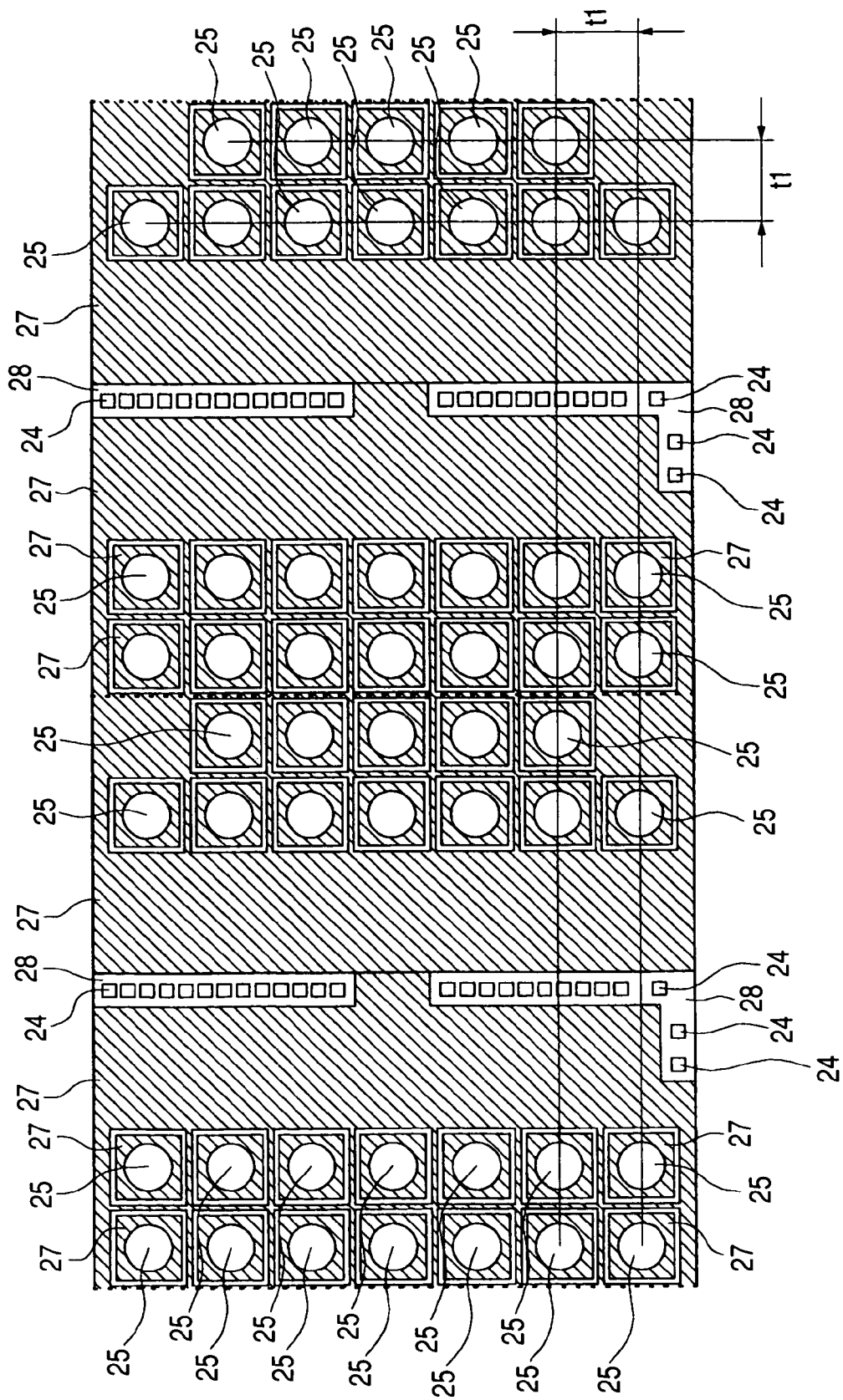
FIG. 8 is a fragmentary enlarged plan view of the thin film probe illustrated in FIG. 7.

FIG. 7 is a plan view of the whole planar pattern of the thin film probe 20, which is illustrated so as to emphasize the layout pattern of the land 25 and reinforcing material 27. Similar to FIG. 5, it shows, for example, a constitution permitting simultaneous testing of 8 rows by 8 columns, constituting 64 chip regions in total. FIG. 8 illustrates a part of the planar pattern of FIG. 7, and it is a fragmentary enlarged plan view illustrating portions corresponding to two chip regions. Similar to FIG. 6, in FIG. 8, only the tip portion of the contact terminal 24 is illustrated and 26 contact terminals 24 are disposed per chip region. In FIG. 8, a region in which the reinforcing material 27 is formed is distinguished by hatching.

As illustrated in FIGS. 7 and 8, on the upper surface of the thin film probe 20, there are a region in which a groove 28 is formed for embedding the elastomer 29 (refer to FIG. 4) therein, a region in which the land 25 is disposed and a region in which a groove for preventing a short circuit between a plurality of lands 25 is formed, while the reinforcing material 27 is formed in all regions other than these three regions. As described above, the reinforcing material 27 is formed of a material having a linear expansion coefficient (thermal expansion coefficient) almost equal to that of the wafer to be tested, so that by forming the reinforcing material 27 in a wide region on the upper surface of the thin film probe 20, it is possible, even if a temperature change occurs, to always keep constant the relative position between the contact terminal 24 and the electrode (test pad) formed over the main surface of the chip region.

In order to bring the contact terminal 24 (refer to FIG. 4) into contact with the electrode (test pad) in a chip region so as to establish electrical conduction between the contact terminal 24 and the electrode (test pad), it may be necessary to break a natural oxide film (not illustrated) that is formed over the surface of the electrode (test pad) to bring the contact terminal 24 into direct contact with the electrode (test pad) itself. As one solution to this problem, the contact terminal 24 (refer to FIG. 4) of the probe card of Embodiment 1 may be replaced with a probe card having a contact terminal made of a cantilever type probe needle, so that the natural oxide film is broken by wiping of the contact terminal after the contact terminal and the electrode (test pad) are brought into contact. However, there is a potential danger in the use of such a technique in that, by this wiping for breaking the natural oxide film, the surface of the electrode (test pad) itself may be damaged. Such a scratch on the surface of the electrode (test pad) presumably lowers the adhesive force between the electrode (test pad) and a bonding wire, when the electrode (test pad) is connected with the bonding wire in a later step. In addition, the electrode (test pad) becomes smaller with chip size reduction, which leads to a relative increase in the ratio of the scratched region in the surface of the electrode (test pad). This may presumably cause further lowering of the adhesion between the electrode (test pad) and the bonding wire.

Thus, in accordance with the present invention, the contact terminal 24 of Embodiment 1 is applied adjacent the surface of the electrode (test pad) itself in such a manner that the tip portion of it pierces the natural oxide film under pushing pressure by the pushing mechanism 20 (refer to FIG. 4), whereby the necessary electrical conduction between the contact terminal 24 and the electrode (test pad) is produced. Compared with the use of a contact terminal made of a cantilever type probe needle, the number of scratches formed on the surface of the electrode (test pad) itself can be reduced. In other words, it is possible to prevent a lowering of the adhesion between the electrode (test pad) and a bonding wire which will be connected in a later step.

Next, the steps used in the manufacture of the thin film probe 20, which was described with reference to FIGS. 4 to 8, will be described with reference to FIGS. 9 to 16. FIGS. 9 to 16 are fragmentary cross-sectional views showing the thin film probe 20 during successive manufacturing steps.

Figure 9:
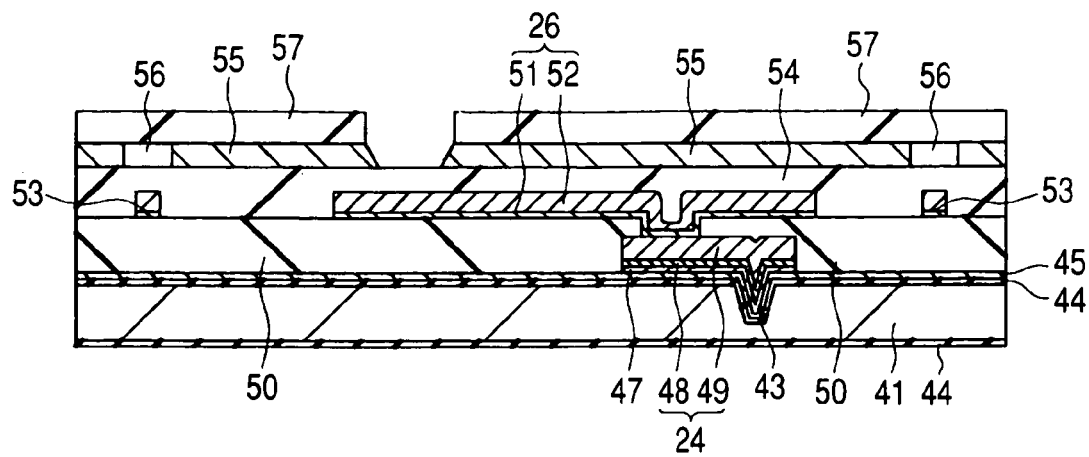
FIG. 9 is a fragmentary cross-sectional view illustrating a step in the fabrication of the thin film probe described based on FIGS. 4 to 8.

As illustrated in FIG. 9, on both sides of a wafer 41, which is made of silicon and has a thickness of from about 0.2 mm to 0.6 mm, a silicon oxide film of about 0.5 μm in thickness is formed by thermal oxidation. Using a photoresist film as a mask, the silicon oxide film on the main surface side of the wafer 41 is etched to form an opening portion reaching the wafer 41 in the silicon oxide film disposed on the main surface side of the wafer 41. Using the remaining silicon oxide film as a mask, the wafer 41 is anisotropically etched with an aqueous solution of a strong alkali (for example, aqueous solution of potassium hydroxide), whereby a hole in prismoid form, surrounded by the (111) plane, is formed on the main surface of the wafer 41.

The silicon oxide film used as a mask upon formation of the hole 43 is then removed by wet etching with a mixture of hydrofluoric acid and ammonium fluoride. The wafer 41 is thermally oxidized to form a silicon oxide film 44 that is about 0.5 μm in thickness all over the wafer 41, including the inside of the hole 43. A conductive film 45 is formed over the main surface of the wafer 41, including the inside of the hole 43. This conductive film 45 can be formed, for example, by depositing a chromium film that is about 0.1 μm in thickness and a copper film that is about 1 μm in thickness successively by sputtering or deposition. Then, a photoresist film is formed over the conductive film 45. By photolithography, the photoresist film is removed from a region in which the contact terminal 24 (refer to FIG. 4) is to be formed in a later step to form an opening portion.

By electroplating using the conductive film 45 as an electrode, high-hardness conductive films 47,48,49 are deposited successively over the conductive film 45 which has appeared on the bottom of the opening portion of the photoresist film. In this Embodiment 1, a nickel film and a rhodium film can be given as examples of the conductive films 47,49 and conductive film 48, respectively. By the steps so far described, the contact terminal 24 can be formed from the conductive films 48,49. The conductive films 45,47 will be removed later, but the removing step will be described later.

After removal of the photoresist film, a polyimide film 50 is formed to cover the contact terminal 24 and conductive film 45. Then, an opening portion reaching the contact terminal 24 is formed in the polyimide film 50. This opening can be formed by boring using a laser or by dry etching using an aluminum film as a mask.

Over the polyimide film 50, including the inside of the opening, a conductive film 51 is formed. This conductive film 51 can be formed, for example, by depositing a chromium film that is about 0.1 μm in thickness and a copper film that is about 1 μm in thickness successively by sputtering or deposition. After formation of a photoresist film over the conductive film 51, the resulting photoresist film is patterned by photolithography and an opening portion reaching the conductive film 51 is formed in the photoresist film. By plating, a conductive film 52 is formed over the conductive film 51 in the opening portion. In this Embodiment 1, a copper film or a laminate film obtained by successively depositing a copper film and a nickel film can be given as an example of the conductive film 52.

After removal of the photoresist film, using the conductive film 52 as a mask, the conductive film 51 is etched to form interconnects 26, made of the conductive films 51,52, and an alignment mark 53. The interconnect 26 can be electrically connected with the contact terminal 24 on the bottom of the opening portion.

Onto the main surface of the wafer 41, a polyimide adhesion sheet or epoxy adhesion sheet, for example, is attached to form an adhesive layer 54. A metal sheet 55 is then firmly adhered onto the upper surface of the adhesive layer 54. As the material of this metal sheet 55, a material having a linear expansion coefficient which is low and, at the same time, close to that of the wafer 41 must be selected. In this Embodiment, 42 Alloy (an alloy of 42% nickel and 58% iron and having a linear expansion coefficient of 4 ppm/° C.) or Invar (an alloy of 36% nickel and 64% alloy and having a linear expansion coefficient of 1.5 ppm/° C.) can be given as an example of the material. Instead of the metal sheet 55, a silicon film having the same material quality as that of the wafer 41 may be formed, or a material having a linear expansion coefficient equal to that of silicon, for example, Super Invar (iron-nickel-cobalt alloy), Kovar (iron-nickel-cobalt alloy) or Cerasin (ceramic-resin mixture), may be employed. Such a metal sheet 55 has an inspection hole 56 formed therein for visually confirming the alignment mark 53. This metal sheet 55 is firmly adhered to the adhesive layer, for example, by stacking the metal sheet 55, which has the inspection hole 56 formed therein, over the wafer 41 having the contact terminal 24 and alignment mark 53 formed thereon, while aligning them by using the alignment mark 53 and inspection hole 53, and by pressure bonding them under heat at the glass transition point of the adhesive layer 54 or greater, while applying a pressure of about 10 to 200 kgf/cm² to them.

Firm adhesion of the metal sheet 55 using the adhesive layer 54 makes it possible to improve the strength and increase the area of the thin film probe 20 thus formed. In addition, it becomes possible to prevent relative misalignment between the thin film probe 20 and the wafer to be tested, which will otherwise occur during the temperature test, thereby maintaining the relative positional accuracy between the thin film probe 20 and the wafer to be tested under various situations.

Using a photoresist film 57 as a mask, the metal sheet 55 is etched. In Embodiment 1, this etching can be actualized by spray etching with an iron chloride solution.

Figure 10:
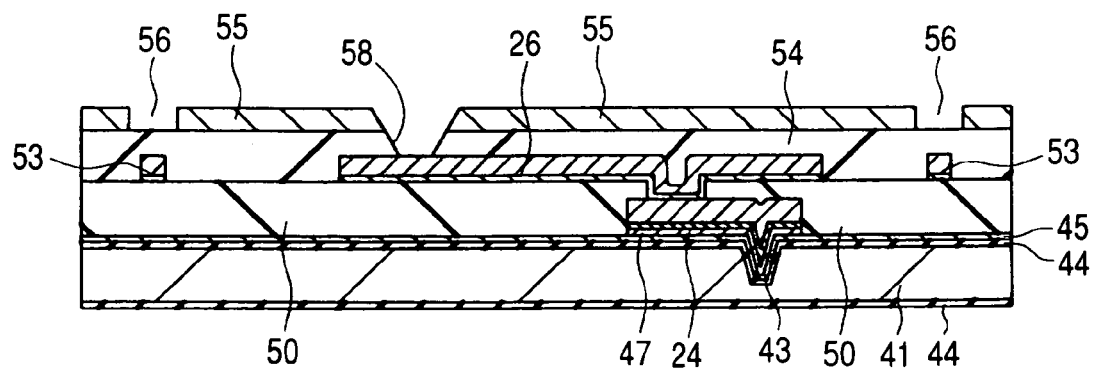
FIG. 10 is a fragmentary cross-sectional view of the thin film probe during a manufacturing step following the step of FIG. 9.

After removal of the photoresist film 57, the adhesive layer 54 is perforated using the metal sheet 55 as a mask, as illustrated in FIG. 10 to form an opening portion 58 reaching the interconnect 26. For this perforation, laser processing using an excimer laser or $CO_2$ gas laser, or dry etching, can be employed. In a later step, the above-described land 25 (refer to FIG. 4) to be electrically connected with the interconnect 26 on the bottom of the opening portion 58 is formed in the opening portion 58.

Figure 11:
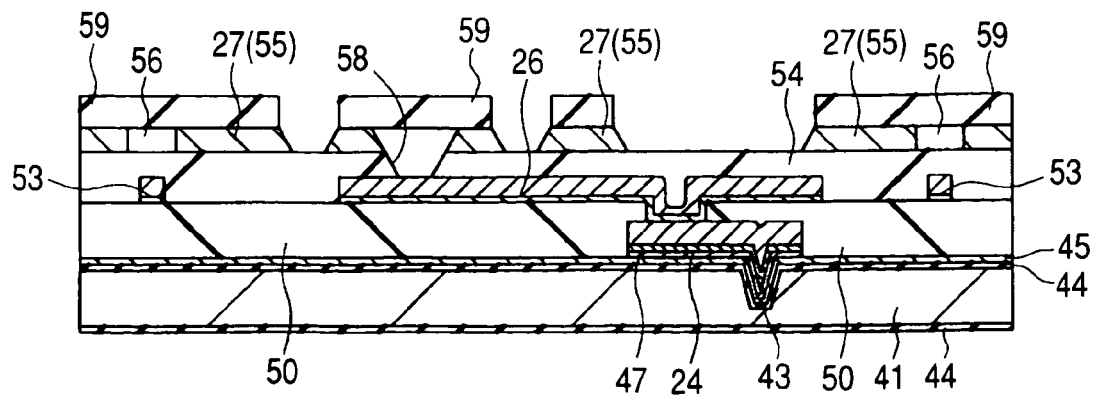
FIG. 11 is a fragmentary cross-sectional view of the thin film probe during a manufacturing step following the step of FIG. 10.

As illustrated in FIG. 11, the metal sheet 55 is etched using a photoresist film 59 to form the reinforcing material 27 (including the groove 28) that is made of the metal sheet 55. The planar pattern of the reinforcing material 27 formed by this etching is the planar pattern of the reinforcing material 27 as described with reference to FIGS. 7 and 8.

Figure 12:
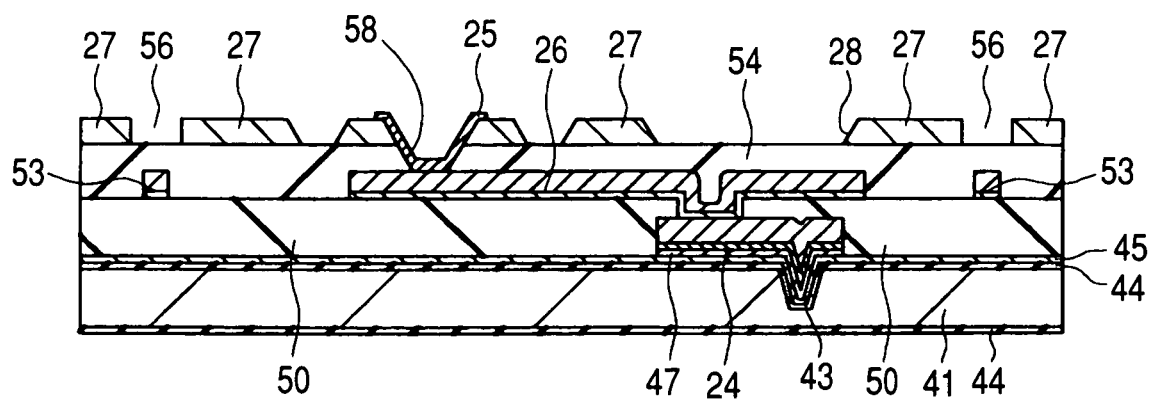
FIG. 12 is a fragmentary cross-sectional view of the thin film probe during a manufacturing step following the step of FIG. 11.

After removal of the photoresist film 59, the land 25 to be electrically connected with the interconnect 26 is formed in the opening 58, as illustrated in FIG. 12. This land 25 can be formed, for example, by successively stacking a copper film, a nickel film and a gold film by electroplating using the interconnect 26 as an electrode. Since the land 25 is formed after formation of the reinforcing material 27 that is made of the metal sheet 55, the reinforcing material 27 can serve as a ground layer, making it possible to prevent disorder of the test signals upon testing using the probe card of Embodiment 1.

Figure 13:
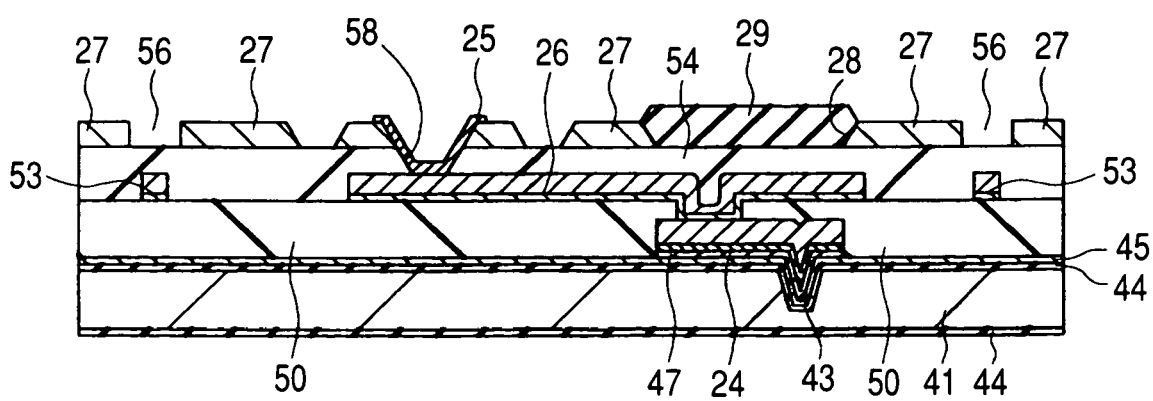
FIG. 13 is a fragmentary cross-sectional view of the thin film probe during a manufacturing step following the step of FIG. 12.

As illustrated in FIG. 13, an elastomer 29 is formed in the groove 28. The elastomer 29 is formed so that a predetermined amount of it protrudes from the groove 28. In Embodiment 1, the elastomer 29 is formed, for example, by printing or applying, through a dispenser, an elastic resin in the groove 28, or placing a silicone sheet therein. As the elastomer 29, a material that is softer (having a smaller elastic modulus) than the elastomer 17 (refer to FIG. 4) must be selected, as described above. This makes it possible to bring the contact terminal 24 into contact with a plurality of electrodes (test pads) without failure, even if strains, such as warp, are generated in the wafer to be tested and a difference in the height is present among the electrodes (test pads) over the main surface of a wafer to be brought into contact with the contact terminal 24. In addition, the elastomer 29 changes partially and absorbs variations in the height of the tip of the individual contact terminals, while relaxing the impact applied when the tip of contact terminals 24 comes into contact with the electrodes (test pads) arranged on the main surface of the wafer to be tested. It uniformly embeds itself, following the irregularities in the height of electrodes (test pads), and actualizes contact between the contact terminal 24 and electrode (test pad).

Figure 14:
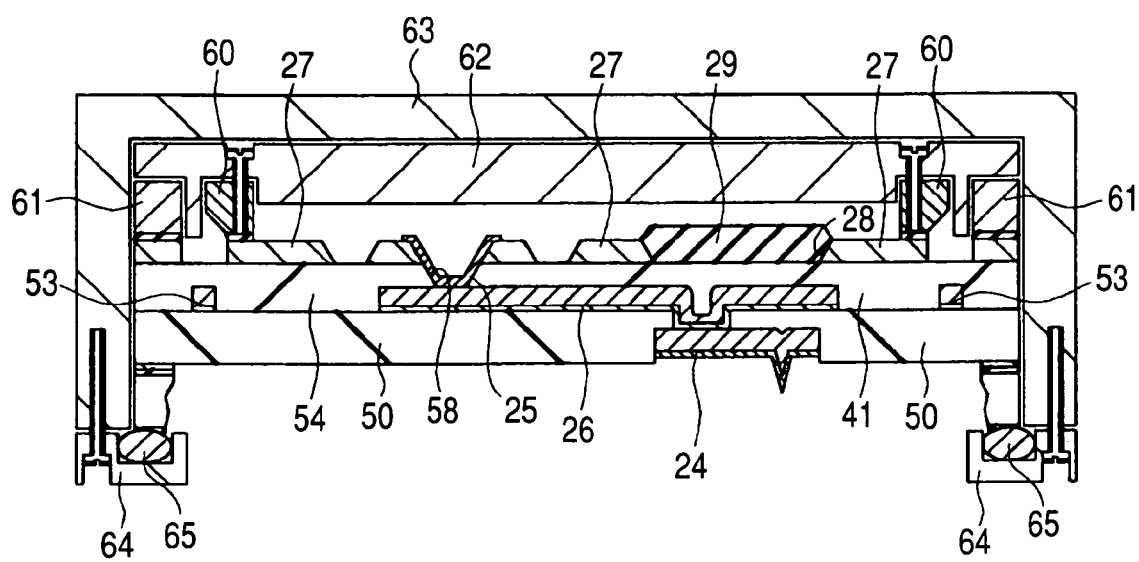
FIG. 14 is a fragmentary cross-sectional view of the thin film probe during a manufacturing step following the step of FIG. 13.

As illustrated in FIG. 14, the thin film probe frame 60 and process ring 61 are adhered to the reinforcing material 27 with an adhesive. Then, a protective film (not illustrated) is adhered to the thin film probe frame 60 and the process ring 61, while a ring-shaped protective film (not illustrated), that is, a film bored at the center thereof, is adhered on the back side of the wafer 41. Using these protective films as a mask, the silicon oxide film 44 is removed from the back side of the wafer 41 by etching with a mixture of hydrofluoric acid and ammonium fluoride.

After removal of the protective film, a fixing jig for silicon etching is attached to the wafer 41. This fixing jig for silicon etching is formed of an intermediate fixing plate 61, a stainless material fixing jig 63, a stainless material lid 64, an O ring 65 and the like. This fixing jig for silicon etching is attached to the wafer 41 by screwing the thin film probe frame 60 down to the intermediate fixing plate 62 and loading the wafer 41 between the fixing jig 63 and lid 64 via the O ring 65. After the wafer 41 is equipped with the fixing jig for silicon etching, the wafer 41, which is a section material for the formation of the thin film probe 20, is removed by etching with an aqueous solution of a strong alkali (for example, an aqueous solution of potassium hydroxide).

Then, the silicon oxide film 44, conductive film 45 and conductive film 47 are removed successively by etching. More specifically, the silicon oxide film 44 is etched with a mixture of hydrofluoric acid and ammonium fluoride, a chromium film contained in the conductive film 45 is etched with an aqueous solution of potassium permanganate, and a copper film contained in the conductive film 45 and a nickel film, serving as the conductive film 47, are etched with an alkaline copper etchant. By the steps so far described, a rhodium film, which is a conductive film 48 (refer to FIG. 9) forming the contact terminal 24 appears from on surface of the contact terminal 24. The contact terminal 24, having the rhodium film formed on the surface thereof, is able to provide a stabilized contact resistance, because solder and aluminum, which are materials for the plurality of electrodes (test pads) on the main surface of the wafer to be brought into contact with the contact terminal 24, do not stick thereto easily, and the contact terminal has a higher hardness than nickel and is not oxidized easily.

Figure 15:
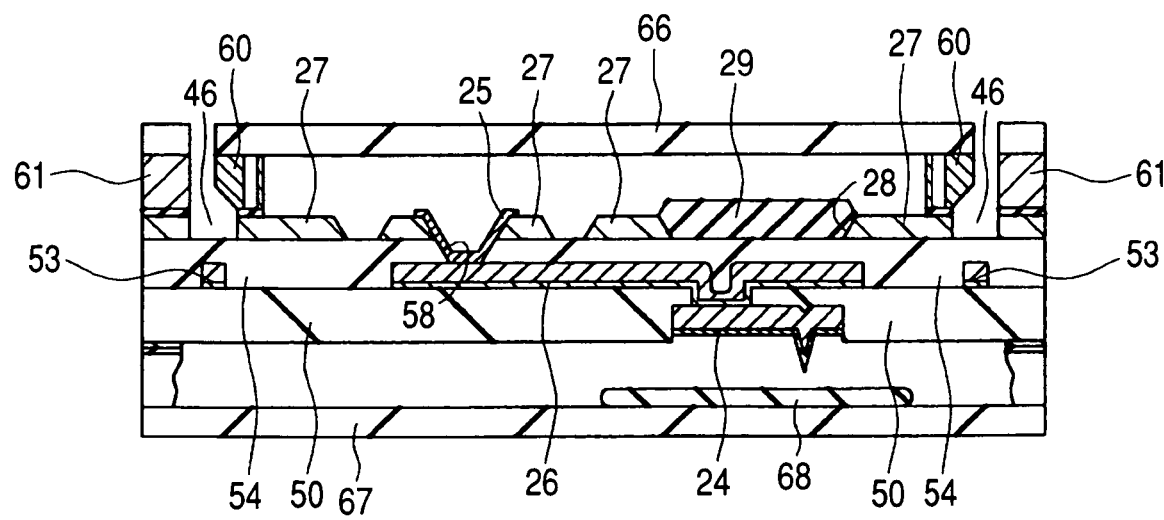
FIG. 15 is a fragmentary cross-sectional view of the thin film probe during a manufacturing step following the step of FIG. 14.

After elimination of the fixing jig for the silicon etching, a protective film 66 is adhered to the surface to which the thin film probe frame 60 and process ring 61 have been attached, and a protective film 67 is adhered onto the surface on which the contact terminal 24 is formed, as illustrated in FIG. 15. An anti-contamination material 68 is disposed in a region of the protective film 67 opposite to the contact terminal 24 in order to prevent the tip portion of the contact terminal 24 from contamination or breakage owing to contact with the protective film 67. Then, the protective film 66 over the alignment mark 53 is removed.

Figure 16:
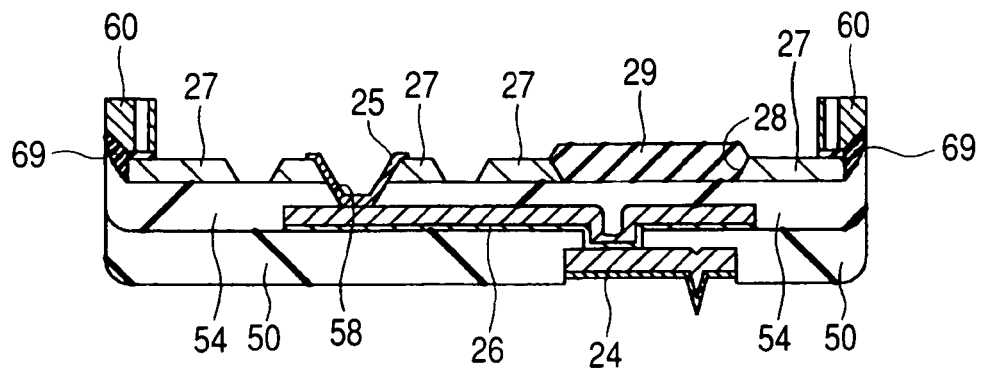
FIG. 16 is a fragmentary cross-sectional view of the thin film probe during a manufacturing step following the step of FIG. 15.

As illustrated in FIG. 16, an adhesive 69 is then applied between the thin film probe frame 60 and adhesive layer 54. An end portion of the thin film probe frame 60 is firmly adhered to the deformed adhesive layer 54 while pushing the thin film probe frame 60 downwards. The protective films 66,67, and the polyimide film 50, adhesive layer 54 and adhesive 69 integrated along the peripheral portion of the thin film probe frame 60 are cut out, whereby the thin film probe 20 of Embodiment 1 is manufactured.

The manufacturing steps used in the fabrication of the thin film probe 20, as described above, are described also in Japanese Patent Application No. 2002-289377 filed by the present inventors.

For improving the throughput of a wafer-level test (for example, probe test) of a semiconductor integrated circuit, shortening of the time necessary for the test per wafer is desired. The time T0 required for the test per wafer is represented, for example, by the equation: $T0=(T1+T2)\times N+T3$, wherein T1 is the time necessary for a single test by a semiconductor prober, T2 is the time necessary for indexing of a probe card, N is the number of touchdown times to bring a probe (contact terminal 24 (refer to FIG. 4) in Embodiment 1) of a prober into contact with the wafer, and T3 is the time necessary for replacement of the wafer by a new one. According to this equation, the number of touchdown times must be reduced in order to improve the throughput of a wafer-level test of a semiconductor integrated circuit device. The shot efficiency K is represented by the following equation: $K=M1/(M2 \times N)$, wherein M1 is the number of chip regions formed on one wafer and M2 is the number of chip regions with which a probe card can have contact simultaneously. A poor shot efficiency K means poor efficiency in the use of the probe card and an increase in the number of touchdown times. Also, this equation for the determination of the shot efficiency K evidences the need for a decrease in the number N of touchdown times.

Various examples of simultaneous testing of multiple chip regions (including simultaneous testing of super multiple chip regions) in the wafer-level test of a semiconductor integrated circuit and the shot efficiency of each example will next be described with reference to FIGS. 17 to 24.

Figure 17:
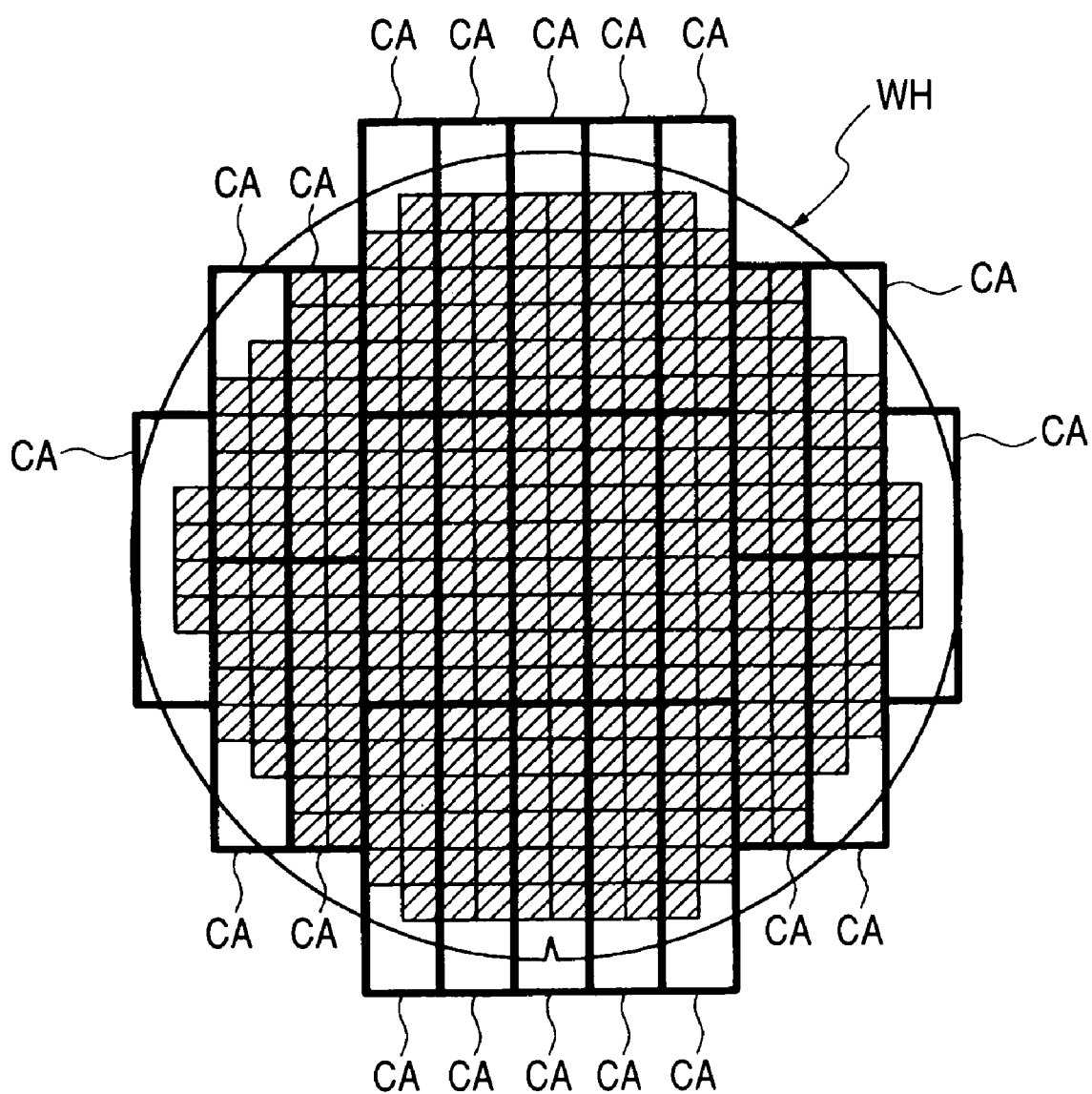
FIG. 17 is a plan view illustrating one example of the arrangement of chip regions, in the wafer plane, to be tested by a semiconductor prober by single contact of a probe card.

FIG. 17 is a plan view illustrating one example of the layout of chip regions in a wafer plane, which regions are to be tested by a semiconductor prober by single contact of a probe card. The chip regions are distinguished by hatching.

According to the example illustrated in FIG. 17, 312 chip regions are disposed within the plane of a wafer WH, and each contact region (first region) CA with which a probe card comes into contact simultaneously is caused to correspond to 16 chip regions, that is, 2 chip regions in the lateral direction of the paper and 8 chip regions in the lengthwise direction, so that a test of a semiconductor integrated circuit for all the chip regions within the plane of the wafer WH can be completed by the contact of a probe card 13 times. In this case, the shot efficiency is about 78% when determined in accordance with the above-described equation for determining the shot efficiency.

Figure 18:
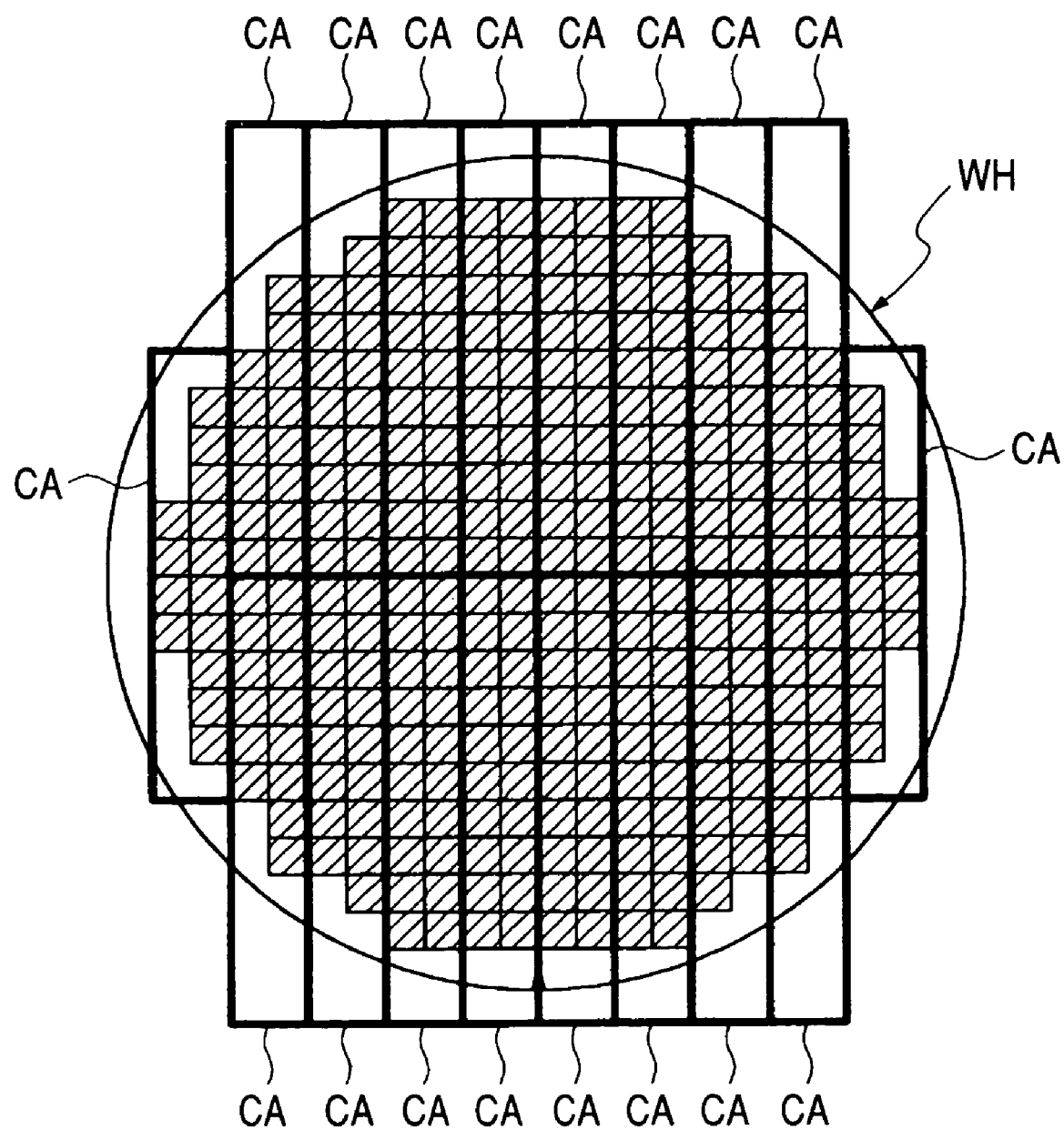
FIG. 18 is a plan view illustrating another example of the arrangement of chip regions, in the wafer plane, to be tested by a semiconductor prober by single contact of a probe card.

FIG. 18 is also a plan view illustrating one example of the layout, within a wafer plane, of chip regions to be tested by a semiconductor prober by single contact of a probe card. The chip regions are distinguished by hatching.

According to the example illustrated in FIG. 18, 312 chip regions are disposed within the plane of a wafer WH, and each contact region CA with which a probe card can comes into contact simultaneously is 24 chip regions in total, that is, 2 chip regions in the lateral direction of the paper and 12 chip regions in the lengthwise direction so that a test of a semiconductor integrated circuit for all the chip regions within the plane of the wafer WH can be completed by the contact of a probe card 18 times. In this case, the shot efficiency is about 72% when determined in accordance with the above-described equation for determining the shot efficiency.

Figure 19:
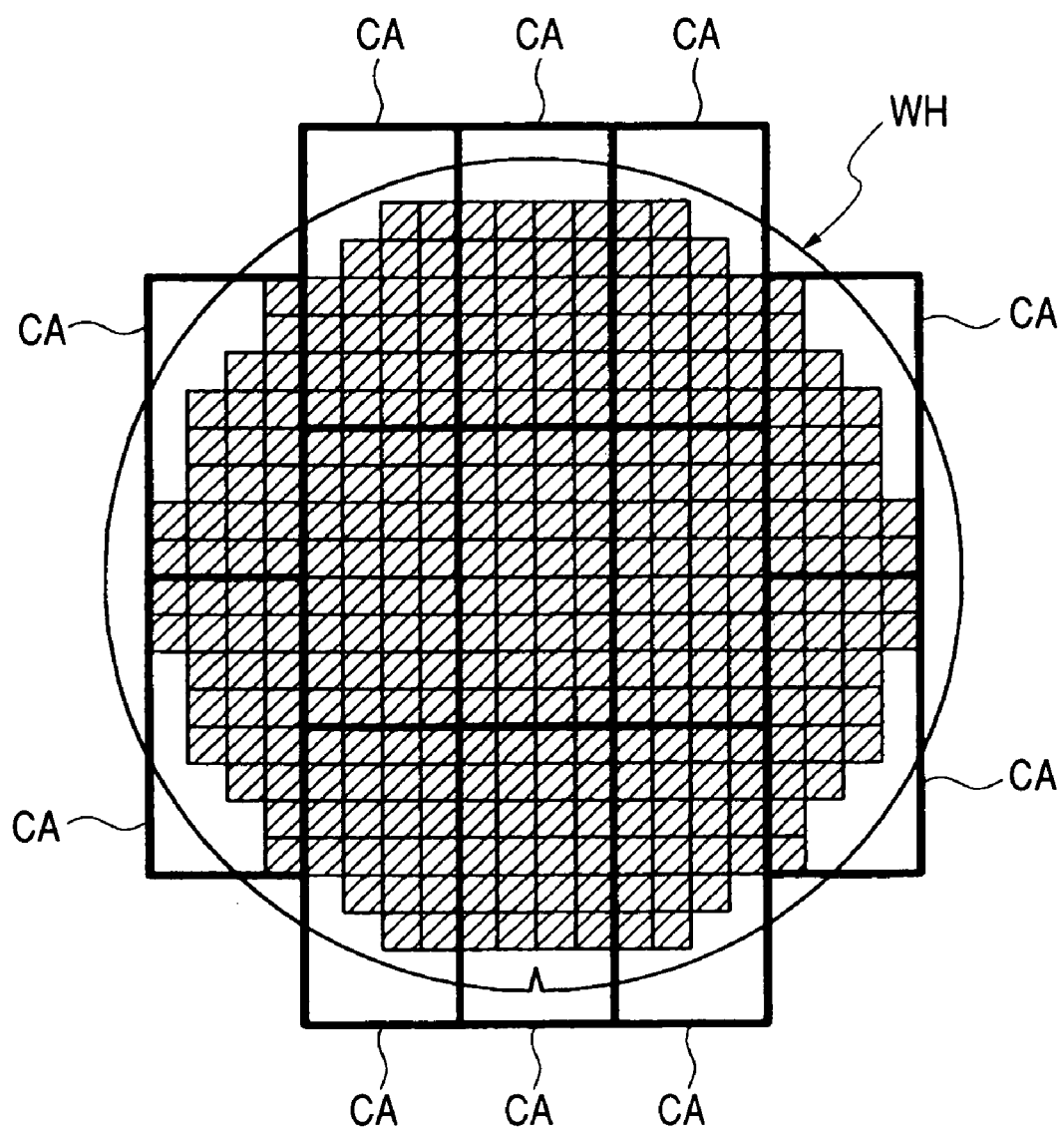
FIG. 19 is a plan view illustrating a further example of the arrangement of chip regions, in the wafer plane, to be tested by a semiconductor prober by single contact of a probe card.

FIG. 19 is also a plan view illustrating one example of the layout, within a wafer plane, of chip regions to be tested by a semiconductor prober by single contact of a probe card. The chip regions are distinguished by hatching.

According to the example illustrated in FIG. 19, 312 chip regions are disposed within the plane of a wafer WH, and each contact region CA with which a probe card can come into contact simultaneously is 32 chip regions in total, that is, 4 chip regions in the lateral direction of the paper and 8 regions in the lengthwise direction, so that a test of a semiconductor integrated circuit for all the chip regions within the plane of the wafer WH can be completed by the contact of a probe card 13 times. In this case, the shot efficiency is about 75% when determined in accordance with the above-described equation for determining the shot efficiency.

Figure 20:
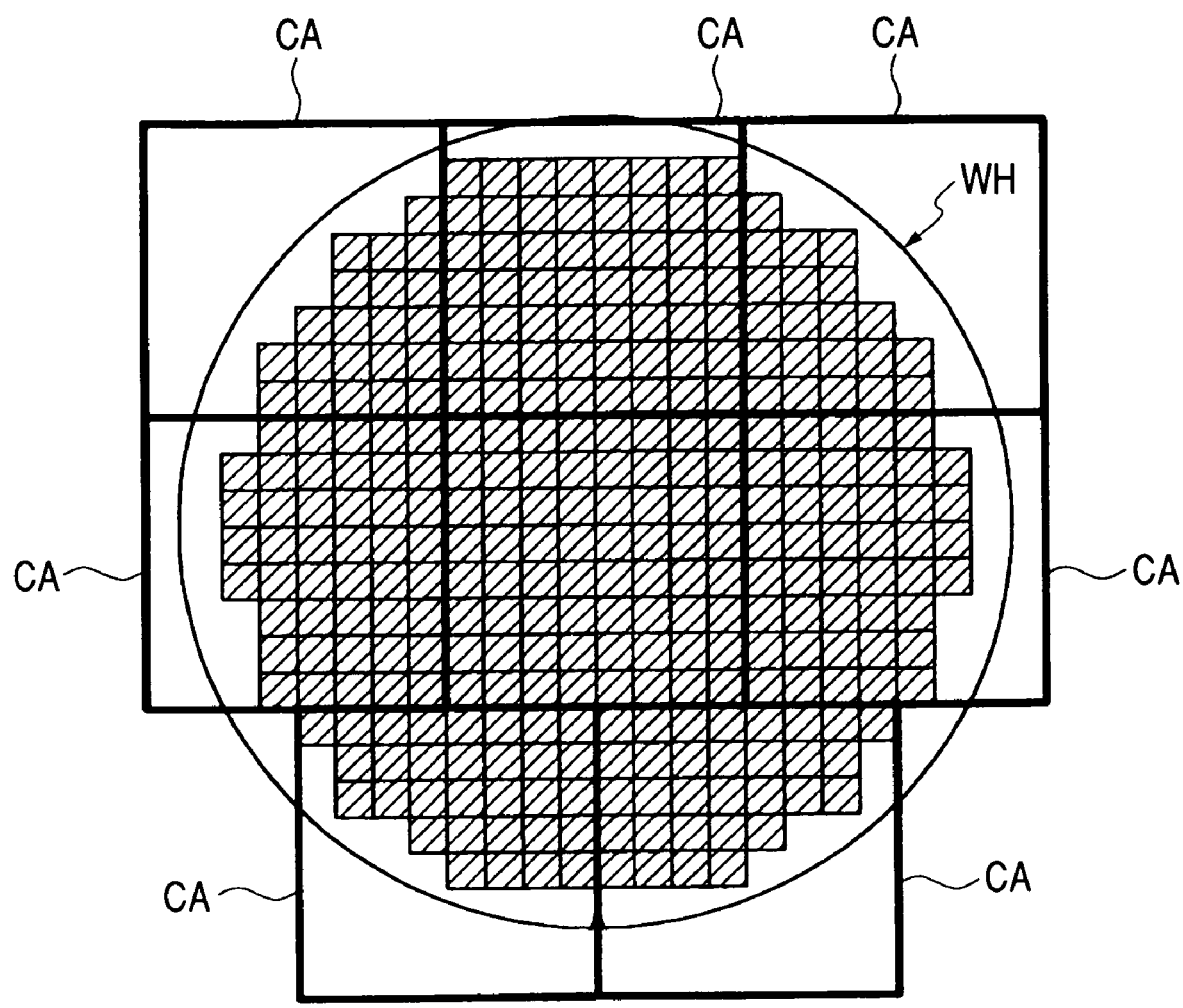
FIG. 20 is a plan view illustrating a still further example of the arrangement of chip regions, in the wafer plane, to be tested by a semiconductor prober by single contact of a probe card.

FIG. 20 is also a plan view illustrating one example of the layout, within a wafer plane, of chip regions to be tested by a semiconductor prober by single contact of a probe card. The chip regions are distinguished by hatching.

According to the example illustrated in FIG. 20, 312 chip regions are disposed within the plane of a wafer WH, and each contact region CA with which a probe card comes into contact simultaneously is caused to correspond to 64 chip regions in total, that is, 8 chip regions in the lateral direction of the paper and 8 regions in the lengthwise direction, so that a test of a semiconductor integrated circuit for all the chip regions within the plane of the wafer WH can be completed by the contact of a probe card 8 times. In this case, the shot efficiency is about 61% when determined in accordance with the above-described equation for determining the shot efficiency.

Figure 21:
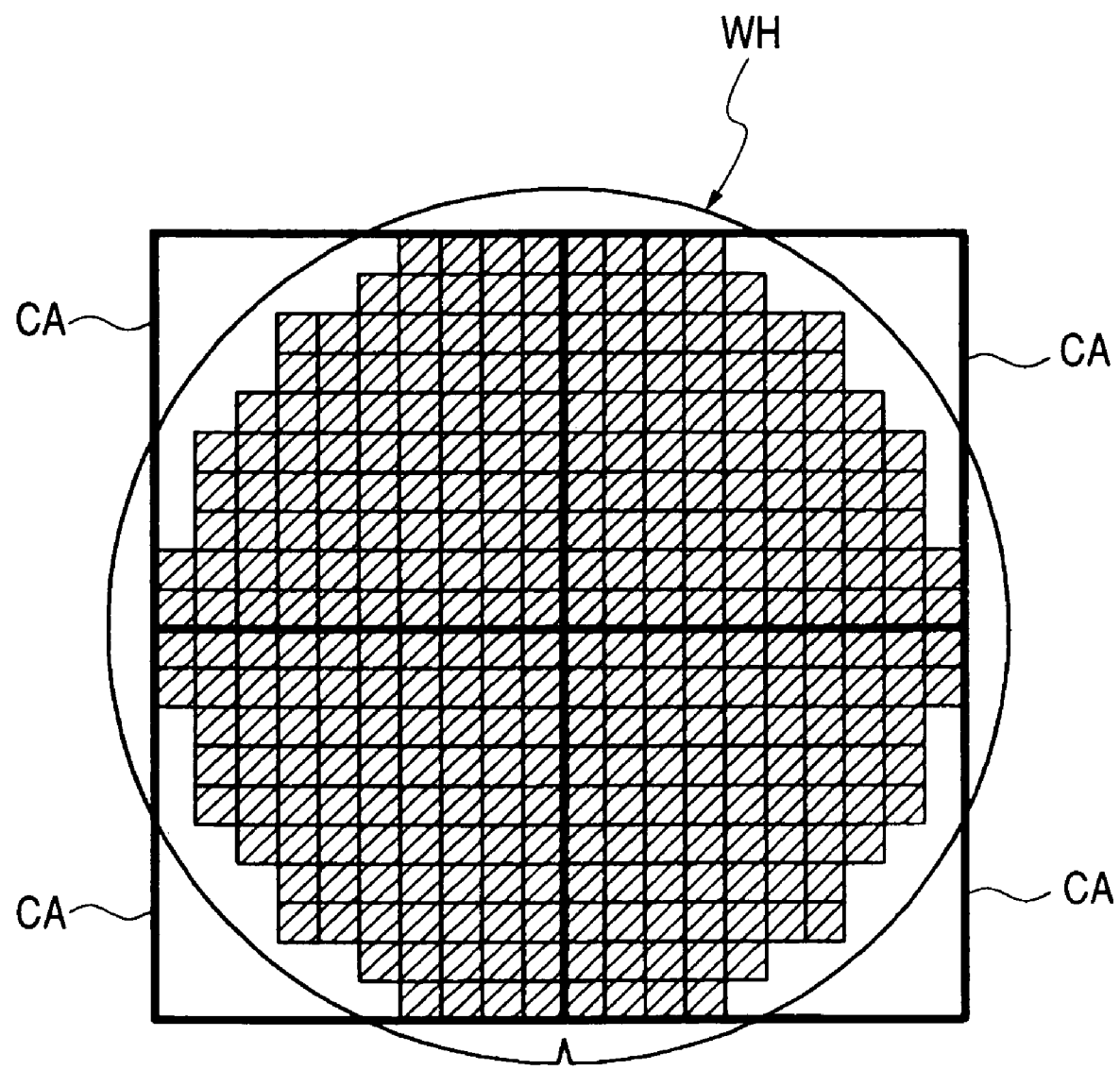
FIG. 21 is a plan view illustrating a still further example of the arrangement of chip regions, in the wafer plane, to be tested by a semiconductor prober by single contact of a probe card.

FIG. 21 is also a plan view illustrating one example of the layout, within a wafer plane, of chip regions to be tested by a semiconductor prober by single contact of a probe card. The chip regions are distinguished by hatching.

According to the example illustrated in FIG. 21, 312 chip regions are disposed within the plane of a wafer WH, and each contact region CA with which a probe card comes into contact simultaneously is caused to correspond to 100 chip regions in total, that is, 10 chip regions in the lateral direction of the paper and 10 regions in the lengthwise direction, so that a test of a semiconductor integrated circuit for all the chip regions within the plane of the wafer WH can be completed by the contact of a probe card 4 times. In this case, the shot efficiency is about 78% when determined in accordance with the above-described equation for determining the shot efficiency.

Figure 22:
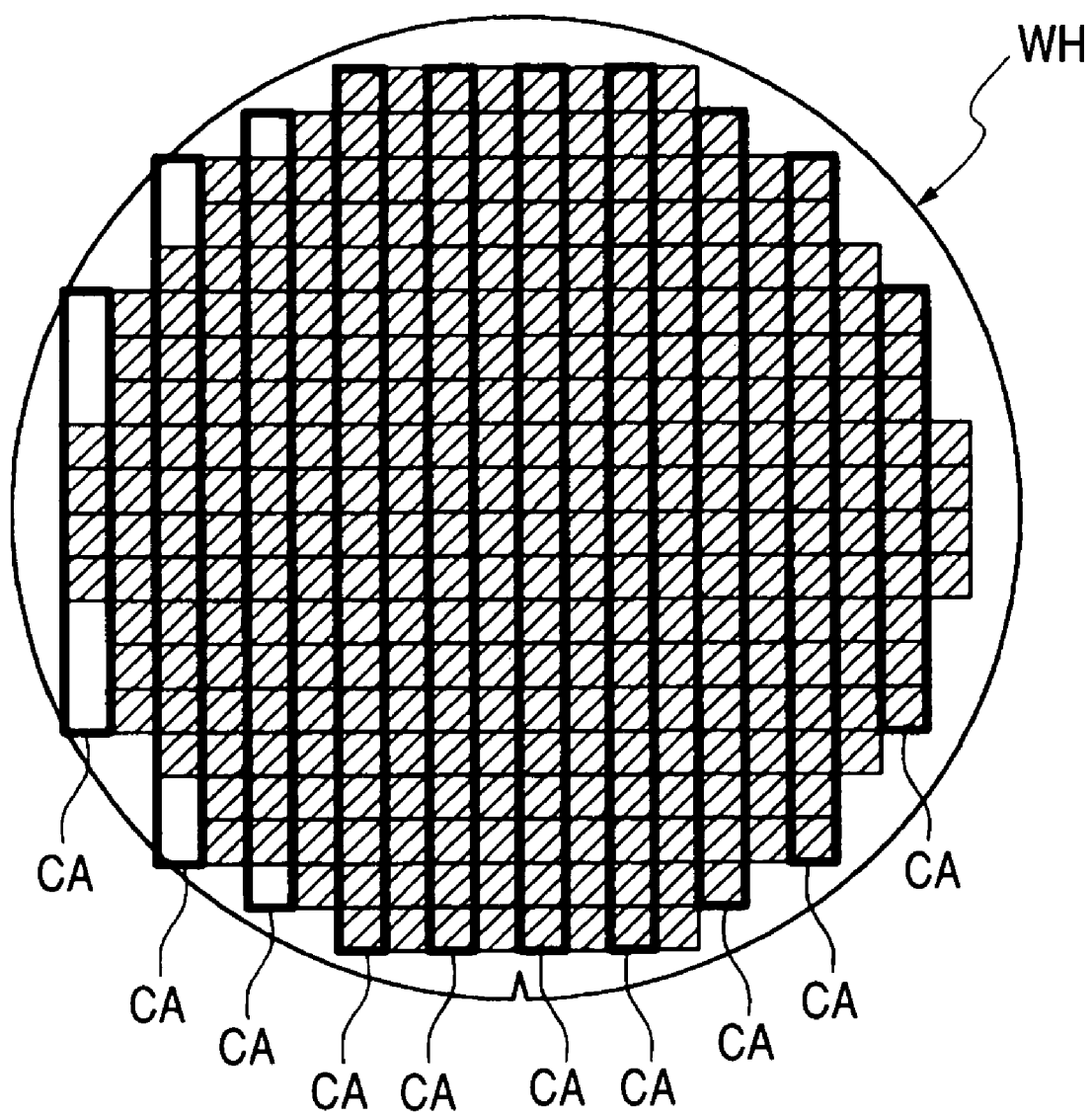
FIG. 22 is a plan view illustrating a still further example of the arrangement of chip regions, in the wafer plane, to be tested by a semiconductor prober by single contact of a probe card.

FIG. 22 is also a plan view illustrating one example of the arrangement, within a wafer plane, of chip regions to be tested by a semiconductor prober by single contact of a probe card. The chip regions are distinguished by hatching.

According to the example illustrated in FIG. 22, 312 chip regions are disposed within the plane of a wafer WH, and each contact region CA with which a probe card (contact terminal 24) comes into contact simultaneously is caused to correspond to all other chip regions so that a test of a semiconductor integrated circuit for all the chip regions within the plane of the wafer WH can be completed by the contact of a probe card twice. In this case, the number of chip regions with which the probe card can come into contact simultaneously is 168. The shot efficiency is therefore about 93% when determined in accordance with the above-described equation for determining the shot efficiency.

Figure 23:
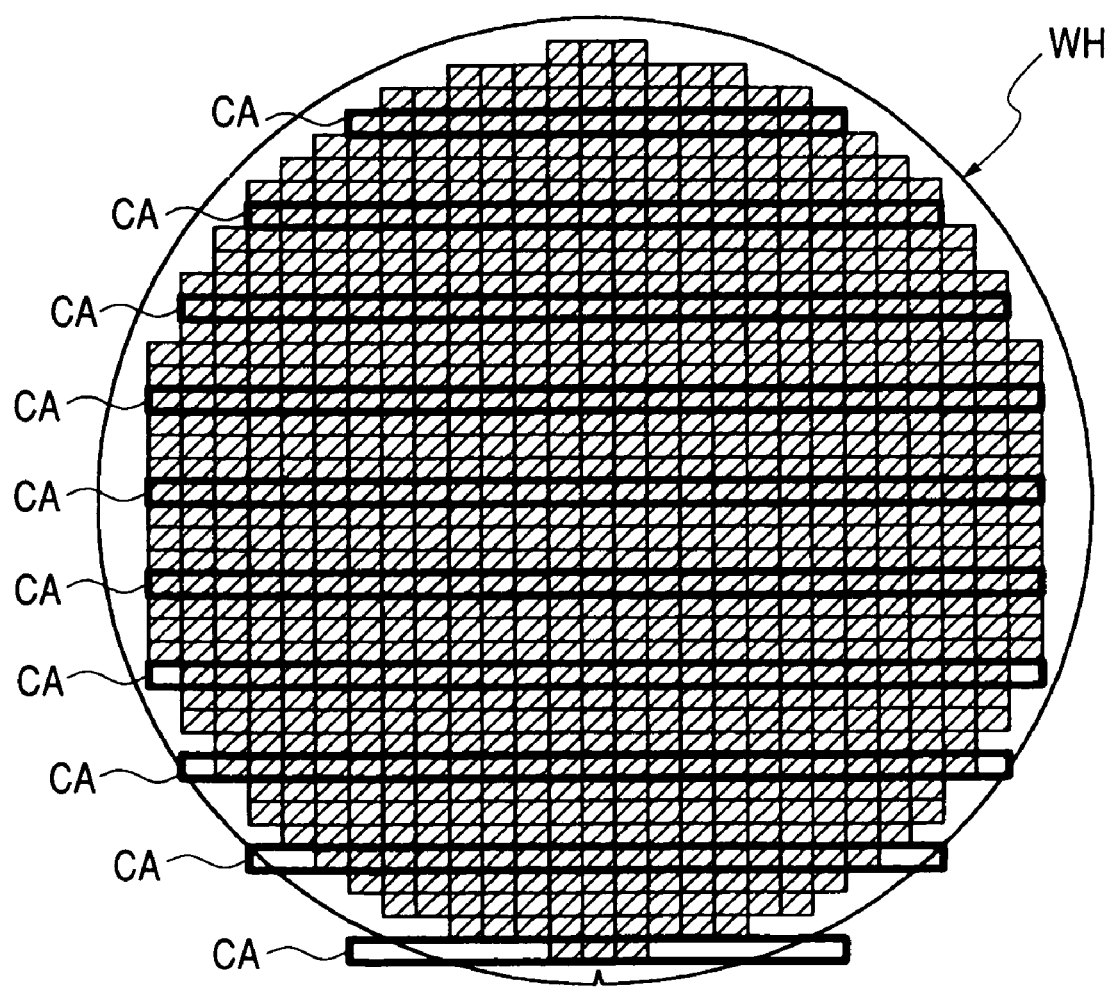
FIG. 23 is a plan view illustrating a still further example of the arrangement of chip regions, in the wafer plane, to be tested by a semiconductor prober by single contact of a probe card.

FIG. 23 is also a plan view illustrating one example of the layout, within a wafer plane, of chip regions to be tested by a semiconductor prober by single contact of a probe card. The chip regions are distinguished by hatching.

According to the example illustrated in FIG. 23, 856 chip regions are disposed within the plane of a wafer WH, and each contact region CA with which a probe card (contact terminal 24) can come into contact simultaneously is caused to correspond to every four chip regions so that a test of a semiconductor integrated circuit for all the chip regions within the plane of the wafer WH can be completed by the contact of a probe card 4 times. In this case, the number of chip regions with which a probe card can get in touch simultaneously is 230. The shot efficiency is therefore about 93% when determined based on the above-described equation for determining the shot efficiency.

Figure 24:
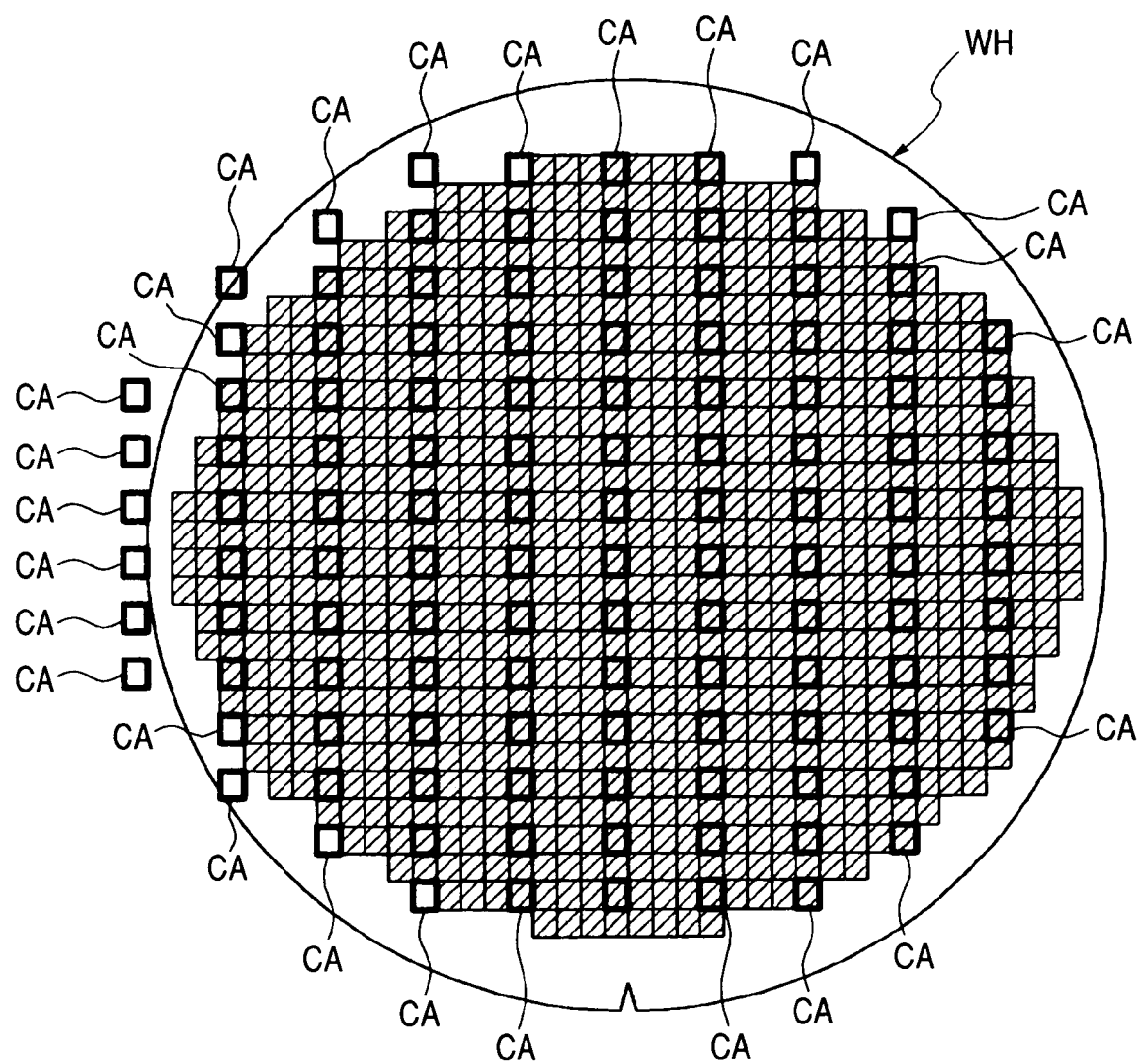
FIG. 24 is a plan view illustrating a still further example of the arrangement of chip regions, in the wafer plane, to be tested by a semiconductor prober by single contact of a probe card.

FIG. 24 is also a plan view illustrating one example of the layout, within a wafer plane, of chip regions to be tested by a semiconductor prober by single contact of a probe card. The chip regions are distinguished by hatching.

According to the example illustrated in FIG. 24, 828 chip regions are disposed within the plane of a wafer WH, and a contact region CA with which a probe card (contact terminal 24) can come into contact simultaneously is caused to correspond to predetermined chip regions selected at equal intervals, so that a test of a semiconductor integrated circuit for all the chip regions within the plane of the wafer WH can be completed by the contact of a probe card 8 times. In this case, the number of chip regions with which a probe card can come into contact simultaneously is 118. The shot efficiency is therefore about 88% when determined in accordance with the above-described equation for determining the shot efficiency.

As described with reference to FIGS. 17 to 24, when the contact region CA is defined as a rectangular shape, as illustrated in FIGS. 17 to 21, the shot efficiency becomes less than 80%, while it can be increased to 80% or greater when the contact region CA is defined by selecting chip regions of predetermined columns or rows or selecting them at some intervals from the whole wafer WH plane, as illustrated in FIGS. 22 to 24. With regard to the touchdown times, a drastic reduction can be realized in the cases shown in FIGS. 22 to 24, compared with the case where the contact region CA has a rectangular shape (except for the examples shown in FIGS. 20 and 21). In other words, the time necessary for the test of one wafer can be reduced by defining the contact region CA by selecting chip regions of predetermined columns or rows, or selecting them at some intervals from the whole wafer WH plane as illustrated in FIGS. 22 to 24. As a result, the throughput of the wafer-level test of a semiconductor integrated circuit can be improved.

When the probe needle is a cantilever type, there is a potential danger that the pitch between electrodes (test pads) within a chip region will decrease with the narrowing thereof, leading to difficulty in insertion of probe needles to the probe card. When the probe needle is a cantilever type and the electrodes (test pads) formed in the chip region are drawn up in two lines along two sides opposite to each other, the insertion of pins is possible in the case of the contact region CA corresponding to dual row chip regions, as illustrated in FIGS. 17 and 18. When the contact region includes more chip regions (for example, as illustrated in FIGS. 19 to 21) or when a contact region CA corresponds to chip regions of predetermined rows or columns or chip regions selected at some intervals in the whole wafer WH plane (for example, as illustrated in FIGS. 22 to 24), it becomes impossible to insert the pins in consideration of the extending direction of the probe needles. In other words, for a cantilever type probe needle, simultaneous testing of multiple chip regions, as illustrated in FIGS. 22 to 24, which can actualize a high shot efficiency and less touchdown frequency, is impossible. On the other hand, in the probe card of Embodiment 1, which was described with reference to FIGS. 1 to 16, simultaneous testing of multiple chip regions, as illustrated in FIGS. 22 to 24, can be carried out because the tip portion of the contact terminal 24 (refer to FIG. 4) can be aligned with the electrode (test pad) all over the main surface of a wafer WH to be tested. It is also possible to decrease the number of touchdown times to once, when the tip portion of the contact terminal 24 is disposed in alignment with the each of the electrodes (test pads) in all the chip regions formed in a wafer WH to be tested.

Figure 25:
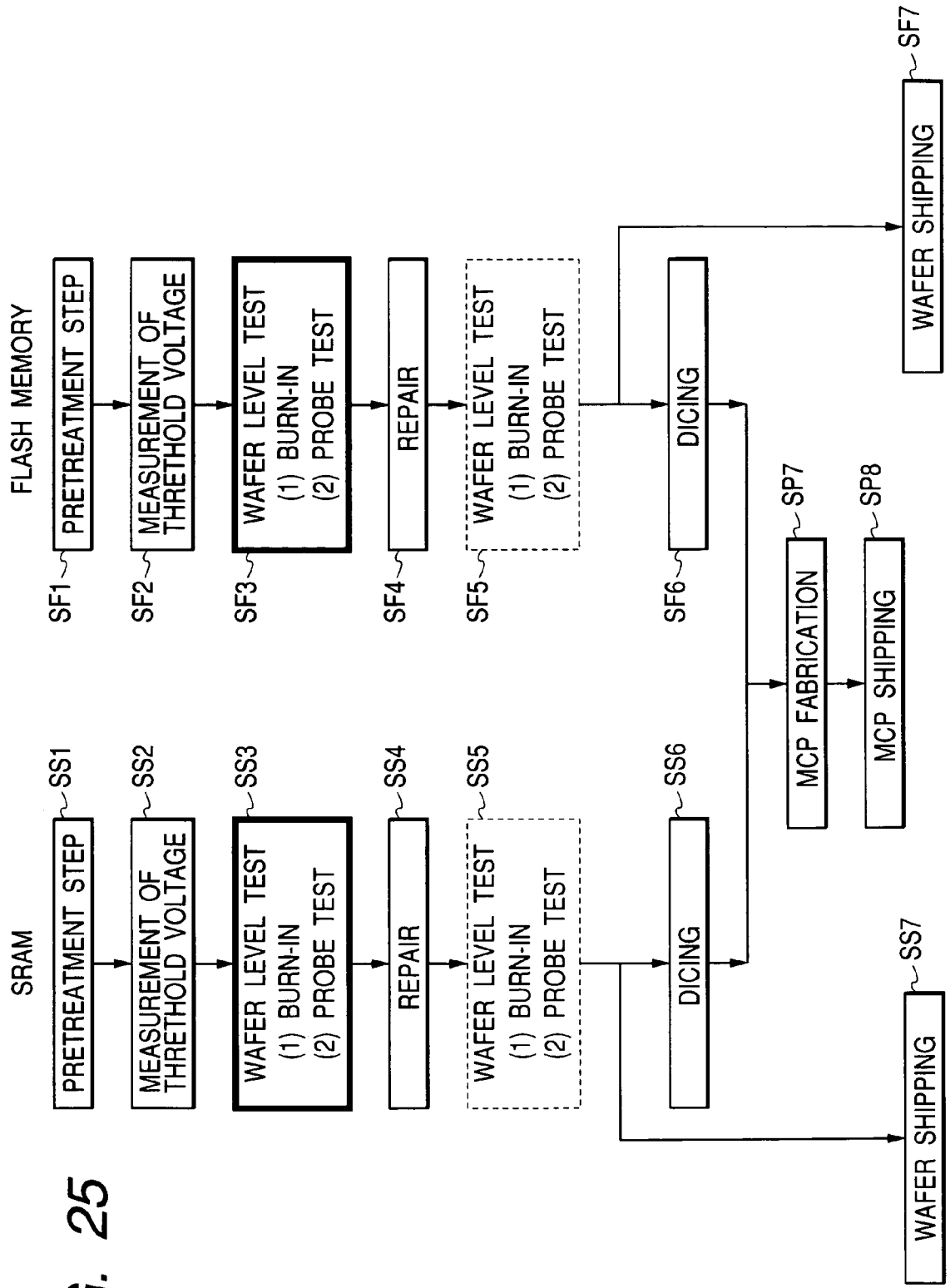
FIG. 25 is a flow chart illustrating steps in the fabrication of the semiconductor integrated circuit device according to the one embodiment of the present invention.

Based on FIG. 25, one example of the method of fabrication of the semiconductor integrated circuit device of Embodiment 1 will be described. FIG. 25 is a flow chart illustrating the method of fabrication of the semiconductor integrated circuit device. In this Embodiment 1, a MCP (Multi Chip Package) having both a SRAM (Static Random Access Memory) and an Electric Erasable Programmable Read Only Memory EEPROM (which will hereinafter be called "flash memory") will be employed as one example of the semiconductor integrated circuit device.

By a pretreatment step, many elements constituting the SRAM and flash memory are formed over the device surface (main surface) of two wafers, respectively. More specifically, by this step, each desired integrated circuit is formed over a semiconductor wafer made of, for example, single crystal silicon by repeating, in accordance with the respective specifications of the SRAM and flash memory, various wafer processing steps, such as oxidation, diffusion, impurity implantation, formation of wiring patterns, formation of an insulating layer and formation of a wiring layer (Steps SS1, SF1).

Then, a DC operating characteristic test of an MIS constituting a TEG (Test Element Group) formed in a scribe region for dividing the wafer into a plurality of chip regions is performed. More specifically, the threshold voltage of the MISs forming SRAM and flash memory is inspected by measuring the threshold voltage of the MIS constituting the TEG (Steps SS2, SF2).

The wafer having many elements formed thereover is then tested (wafer level test) (Steps SS3, SF3). A burn-in test and a probe test are carried out successively here. Prior to the burn-in test, a simple probe test is sometimes inserted as needed. In the burn-in test, at least a rated supply voltage is applied to the wafer in a high temperature (for example, 125 to 150° C.) atmosphere to pass an electric current through the integrated circuit. By application of such temperature and voltage stresses to the chips, chips which may be defective in the future are screened. In the probe test, on the other hand, a function test is performed, in which the memory function of the wafer is tested using a specific test pattern according to reading and writing operations to the SRAM and flash memory in a high temperature (for example, 85 to 95° C.) atmosphere to confirm whether the wafer functions to specification or not; an open/short test is performed between input and output terminals; a leakage current inspection is performed; a DC test such as measurement of the supply current, is performed; and an AC test for testing the AC timing of memory control and the like is conducted. In the wafer-level probe test step, a semiconductor prober having the probe card of Embodiment 1, as described with reference to FIGS. 1 to 16, is employed. The probe card of Embodiment 1 can also be used in the wafer-level burn-in test step. Such a wafer-level test makes it possible to feed back the data of the burn-in test on defective wafers and the like to the pretreatment step, by which any difficulties in the pretreatment step can be avoided.

In the steps SS3, SF3 as described above, a test such as a long-cycle test or refresh test (about 1 hour to several tens hours) having a testing time as long as that of the burn-in test (about 8 to 48 hours) may be performed. Compared with the test performed after division into individual chips, such a test conducted in the wafer form, while spending long hours, makes it possible to drastically improve the through-put of the fabrication of the semiconductor integrated circuit device of Embodiment 1.

Elements which have been found defective using the burn-in test and probe test are then repaired by exposing them to laser light. More specifically, in this step, failed bits of SRAM and flash memory are found by analyzing the results of the probe test, and a fuse of the redundant repair bits corresponding to the failed bits is cut by the laser light or by cutting an electric fuse via the input of an external voltage, whereby they are repaired by this redundant repair treatment (Steps SS4, SF4). This repair step may be followed by a wafer-level burn-in test step and wafer-level probe test step similar to those described in the steps SS3, SF3. These steps are used for confirming the completion of the replacement of the failed bits with redundant repair bits by the redundant repair treatment. An interference test, for example, a disturb refresh test of a memory cell of the SRAM and flash memory, which can be carried out only after the redundant repair treatment, may be performed. The memory cell of the flash memory may be subjected to a wafer-level write/erase test (Steps SS5, SF5).

The wafer having an SRAM formed thereover and another wafer having flash memory formed thereover are each cut into chips (Steps SS6, SF6). On the other hand, a non-defective wafer may be shipped as a product without cutting it into chips (Steps SS7, SF7).

The steps necessary for the fabrication of the respective chips, having an SRAM and flash memory formed thereover, into an MCP include a die bonding step for loading these chips over a package substrate, a wire bonding step for electrically connecting the pad of each chip with a pad over the package substrate via a wire, a resin molding step for molding the chip and wire portions with a resin in order to protect them, and a lead forming step for forming and surface treating an outer lead. The wire bonding can be replaced with flip chip bonding (Step SP7). The MCP thus fabricated can be shipped as a product and made available to users (Step SP8).

According to the method of fabrication of the semiconductor integrated circuit device of Embodiment 1, the burn-in test and probe test are performed prior to the fabrication of the MCP so that defective chips discovered by the burn-in test or probe test can be repaired. It is therefore possible to fabricate the MCP by KGD, leading to a great improvement in the yield of the MCP. With an increase in the number of chips loaded on the MCP, the improving effect becomes greater.

By performing the burn-in test and probe test while the semiconductor product is in wafer form, the total index time can be shortened. In addition, by the wafer level test, the number of chips to be tested simultaneously can be increased. These advantages makes it possible to improve the throughput of the wafer testing step, leading to a reduction in the fabrication cost of the semiconductor integrated circuit device of Embodiment 1.

Embodiment 2

Figure 26:
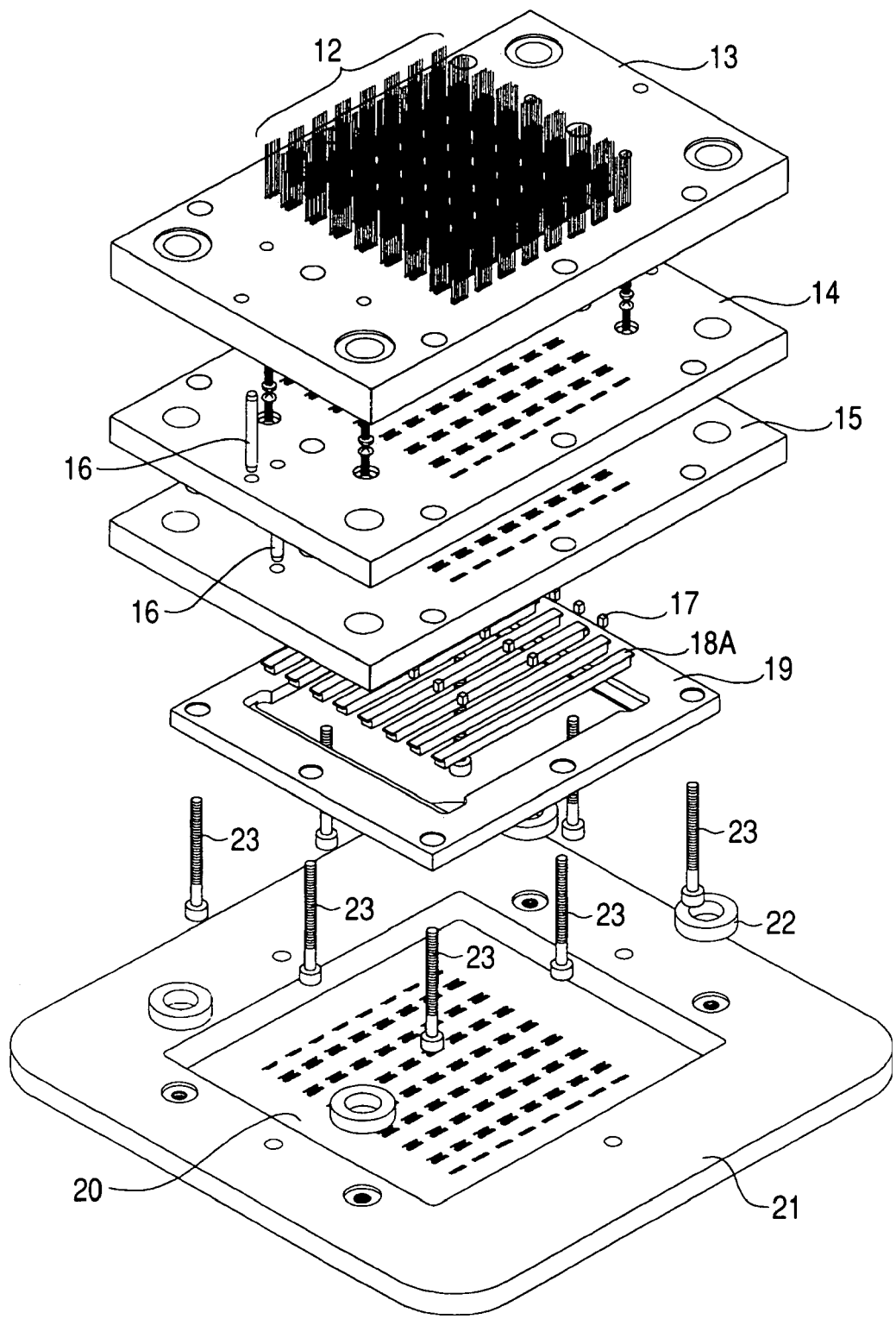
FIG. 26 is an exploded perspective view illustrating the constitution of a lower pushing unit included in a probe card according to another embodiment of the present invention.

FIG. 26 is a perspective view illustrating the constitution of a lower pushing unit according to an Embodiment 2, which is to be attached to the lower surface of the multilayer wiring substrate 1 (refer to FIG. 1) in the manner described with reference to Embodiment 1.

The lower pushing unit of Embodiment 2 is substantially the same as that of Embodiment 1, except for the constitution (refer to FIG. 3) of the lower pushing unit and pusher 18 (refer to FIG. 3). As illustrated in FIG. 26, differently configured a pusher (pushing member) 18A is provided in the lower pushing unit of Embodiment 2. The pusher 18 of Embodiment 1 applies an individual pushing pressure to each chip region by being disposed in a number equal to the number of chip regions with which the probe card comes into contact simultaneously. With regard to the pusher in Embodiment 2, one pusher 18A applies a pushing pressure to a plurality of chip regions, because the number of the pushers 18A of Embodiment 2 is smaller than that of the chip regions with which the probe card comes into contact simultaneously. For example, when the chip regions with which the probe cans comes into contact simultaneously are arranged in 8 rows and 8 columns, one pusher 18A applies a pushing pressure to chip regions of one row or one column, that is, 8 chip regions.

In Embodiment 2, similar effects to those of Embodiment 1 are available.

Embodiment 3

Figure 27:
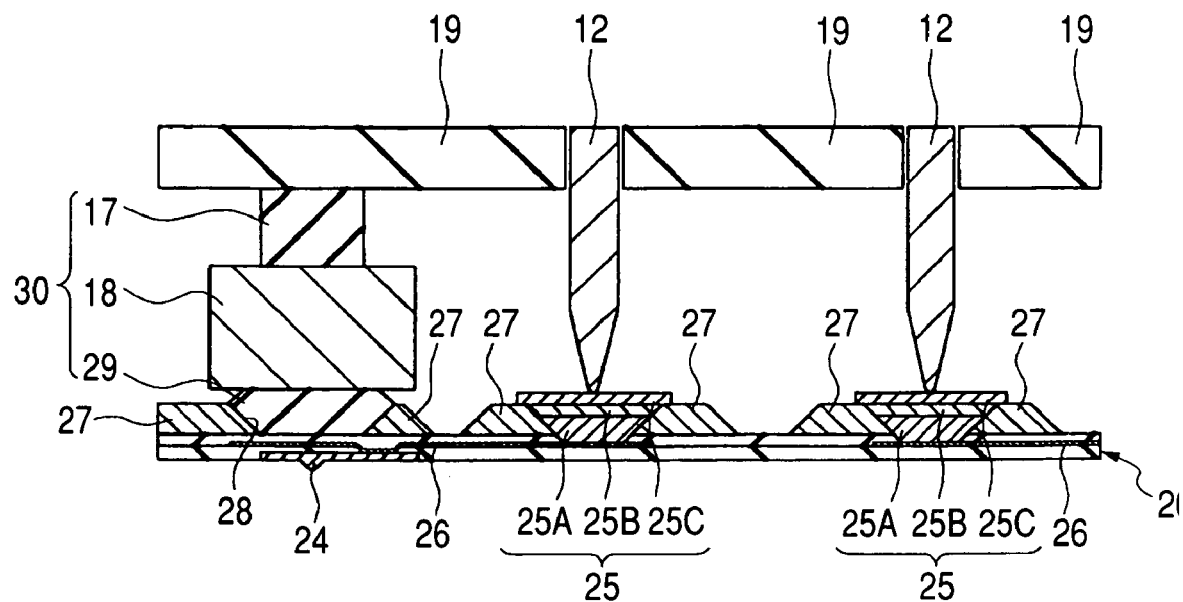
FIG. 27 is a fragmentary cross-sectional view of a lower pushing unit included in a probe card according to a further embodiment of the present invention.

FIG. 27 is a fragmentary cross-sectional view of a lower pushing unit according to Embodiment 3, which is to be attached to the lower surface of the multilayer wiring substrate 1 (refer to FIG. 1) in the manner described with reference Embodiment 1.

The lower pushing unit of Embodiment 3 is substantially the same as that of Embodiment 1, except for the constitution of the thin film probe 20, which forms part of the lower pushing unit. As illustrated in FIG. 27, the thin film probe 20 of Embodiment 3 is formed so that the surface of the land 25 of the thin film probe 20 is flattened, as compared to that (refer to FIG. 4) of Embodiment 1. In other words, the surface of the land 25, with which the POGO pin 12 is in contact, is planarized by increasing the thickness of each of a copper film 25A, a nickel film 25B and a gold film 25C constituting the land 25.

By flattening the surface of the land 25, it is possible to prevent certain problems, such as widening of the indentations formed in the electrodes (test pads) which will otherwise occur as follows: the impact upon contact of the contact terminal 24 with a wafer (electrode (test pad) formed over the main surface of a chip region) to be tested causes the POGO pin 12 to slide on the land 25; and the impact caused by this sliding of the POGO pin 12 on the land 25 is transmitted to the contact terminal 24, causing a widening of the indentations which have been formed in the electrode (test pad) by the contact of the contact terminal 24. By preventing such widening of the indentations, it becomes possible to definitely prevent lowering of the adhesive force between the electrode (test pad) and a bonding wire, when the bonding wire is connected to the electrode (test pad) in a later step.

In the constitution (refer to FIG. 4) of the land 25 of Embodiment 1, similar effects are available by applying, to the POGO pin 12 in advance, a preload capable of pushing the land 25 by its predetermined pushing pressure.

In Embodiment 3 as described above, similar effects to those of Embodiments 1 and 2 are available.

The present invention has been described specifically based on some embodiments. However, it should be borne in mind that the present invention is not limited to or by them. It is needless to say that the invention can be modified within an extent not departing from the scope of the invention.

For example, in the above-described embodiments, a wafer made of silicon which has been anisotropically etched is used as a section material for the formation of a thin film probe. The material is not limited to silicon, and, in addition, treatment other than anisotropic etching may be adopted. For example, glass which has been dry etched can be used instead.

In the above-described embodiments, a hole that is prismoid in form is made by anisotropically etching a wafer which will serve as a section material for the formation of a thin film probe. The hole may have the shape of a pyramid in form instead of being prismoid. The hole can be used insofar as it permits the formation of a contact terminal which can maintain stable contact resistance at a small needle pressure.

An advantage available by a typical feature of the invention is as follows. By the present invention, the throughput of wafer-level electrical testing of a semiconductor integrated circuit device can be improved.

What is claimed is:

1. A fabrication method of a semiconductor integrated circuit device, comprising the steps of:
    (a) preparing a semiconductor wafer which has been divided into a plurality chip regions each having a semiconductor integrated circuit formed thereover, and has, formed over a main surface of the wafer, a plurality of first electrodes to be electrically connected with the semiconductor integrated circuit;
    (b) preparing a first card for retaining a first sheet, which has a plurality of contact terminals to be brought into contact with the first electrodes and interconnects to be electrically connected with the contact terminals, so as to cause tip portions of the contact terminals to protrude toward the main surface of the semiconductor wafer; and
    (c) bringing the contact terminals into contact with the first electrodes to perform an electrical test of the semiconductor integrated circuit device,
    wherein the tip portions of the contact terminals are disposed over a first surface of the first sheet, and a plurality of second electrodes to be electrically connected with interconnects are disposed over a second surface which is opposite to the first surface of the first sheet,
    wherein the first card has a plurality of connection mechanisms to be electrically connected to the second electrodes and pushing mechanisms for pushing the contact terminals toward the first electrodes,
    wherein the connection mechanisms each comprises: an elastic contact needle for pushing the second electrodes by a load generated upon contact of the contact terminals with the first electrodes; and a retainer member for retaining the contact needle and is disposed to get in touch with the second electrodes over the second surface of the first sheet,
    wherein each of the pushing mechanisms is formed by successively stacking a first elastic material, a pushing member and a second elastic material one after another from the side of the first sheet and is disposed above the contact terminals over the second surface of the first sheet, and
    wherein any one of the pushing mechanisms pushes at least one of the contact terminals.

2. A fabrication method of a semiconductor integrated circuit device according to claim 1, wherein the pushing mechanism is disposed over each of the contact terminals over the second surface of the first sheet, and any one of the pushing mechanisms pushes one of the contact terminals.

3. A fabrication method of a semiconductor integrated circuit device according to claim 1, wherein a first reinforcing member is formed in a region of the second surface of the first sheet in which at least the second electrodes are not disposed, and the semiconductor wafer and the first reinforcing member each has a first linear expansion coefficient.

4. A fabrication method of a semiconductor integrated circuit device according to claim 3, wherein the semiconductor wafer has silicon as a main component and the first reinforcing member has, as a main component, 42 alloy, silicon or a material having a linear expansion coefficient almost equal to that of silicon.

5. A fabrication method of a semiconductor integrated circuit device according to claim 1, wherein the first elastic material and the second elastic material change their shapes when a pressure is applied by pushing of the contact terminals against the first electrodes so as to absorb gaps between the tip portions of the contact terminals and the first electrodes.

6. A fabrication method of a semiconductor integrated circuit device according to claim 1, wherein an elastic modulus of the first elastic material is smaller than an elastic modulus of the second elastic material.

7. A fabrication method of a semiconductor integrated circuit device according to claim 1, wherein over the second surface of the first sheet, any two adjacent second electrodes are separated with a first space wider than a space between any two adjacent tip portions of the contact terminals, and the first space between any two adjacent second electrodes is set uniform.

8. A fabrication method of a semiconductor integrated circuit device according to claim 1, wherein the main surface of the semiconductor wafer is divided into a plurality of first regions, each of the chip regions is disposed in any one of the first regions and the step (c) is performed for each of the first regions.

* * * * *